US009071237B2

(12) United States Patent
Lee et al.

(10) Patent No.: US 9,071,237 B2
(45) Date of Patent: Jun. 30, 2015

(54) DIGITAL DUTY CYCLE CORRECTION CIRCUIT

(71) Applicant: SAMSUNG ELECTRONICS CO., LTD., Suwon-si (KR)

(72) Inventors: Cheon-Oh Lee, Cheonan-si (KR); Tae-Pyeong Kim, Seongnam-si (KR); Jung-Myung Choi, Seoul (KR); Sung-Jun Kim, Seongnam-si (KR); Ho-Bin Song, Daejeon (KR); Han-Kyul Lim, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 14/207,751

(22) Filed: Mar. 13, 2014

(65) Prior Publication Data

US 2014/0266362 A1 Sep. 18, 2014

(30) Foreign Application Priority Data

Mar. 15, 2013 (KR) ........................ 10-2013-0027626

(51) Int. Cl.
*H03K 7/08* (2006.01)
*H03K 5/156* (2006.01)

(52) U.S. Cl.
CPC .................................. *H03K 5/1565* (2013.01)

(58) Field of Classification Search
USPC ...................................... 327/31, 35, 172–176
See application file for complete search history.

(56) References Cited

U.S. PATENT DOCUMENTS

| 6,040,726 | A | 3/2000 | Martin |
| 6,169,434 | B1 | 1/2001 | Portmann |
| 6,373,309 | B1 * | 4/2002 | Bang .............................. 327/175 |
| 7,015,739 | B2 * | 3/2006 | Lee et al. ...................... 327/175 |
| 7,199,634 | B2 * | 4/2007 | Cho et al. ....................... 327/175 |
| 7,501,870 | B2 * | 3/2009 | Choi et al. ..................... 327/175 |
| 7,515,004 | B2 | 4/2009 | Shin et al. |
| 7,567,106 | B2 | 7/2009 | Park et al. |
| 7,642,863 | B2 | 1/2010 | Kaneko et al. |
| 7,764,097 | B2 | 7/2010 | Choi |
| 7,777,543 | B2 | 8/2010 | Park |
| 7,847,609 | B2 * | 12/2010 | Shin .............................. 327/175 |
| 8,149,978 | B2 | 4/2012 | Ohtomo et al. |
| 2005/0007168 | A1 | 1/2005 | Park et al. |
| 2005/0184779 | A1 | 8/2005 | Yoo et al. |
| 2007/0109058 | A1 | 5/2007 | Kim et al. |

FOREIGN PATENT DOCUMENTS

| JP | 2005-316722 A | 11/2005 |
| JP | 2007-43691 A | 2/2007 |
| JP | 2007-124661 A | 5/2007 |
| KR | 10-0473813 B1 | 3/2005 |
| KR | 10-0529390 B1 | 11/2005 |
| KR | 10-2008-0011527 A | 2/2008 |
| KR | 10-2009-0101487 A | 9/2009 |

* cited by examiner

*Primary Examiner* — An Luu
(74) *Attorney, Agent, or Firm* — Sughrue Mion, PLLC

(57) ABSTRACT

A digital duty cycle correction circuit includes a duty cycle controller and a digital duty control code generator. The duty cycle controller generates first and second output clock signals by compensating duty cycles of first and second input clock signals based on a digital duty control code. The digital duty control code generator generates the digital duty control code based on a frequency value obtained by converting duty cycle information of the first output clock signal and the second output clock signal.

18 Claims, 18 Drawing Sheets

200a

DIGITAL DUTY CYCLE CORRECTION CIRCUIT

CROSS-REFERENCE TO RELATED APPLICATION

This application claims priority from Korean Patent Application No. 2013-0027626, filed on Mar. 15, 2013, in the Korean Intellectual Property Office, the disclosure of which is incorporated herein by reference in its entirety.

BACKGROUND

1. Field

Apparatuses and methods consistent with exemplary embodiments relate to signal processing, and more particularly, to a digital duty cycle correction circuit.

2. Description of the Related Art

As an electronic system becomes smaller and has a higher operating speed, a semiconductor device included in the electronic system also becomes smaller and has a higher operating speed. Typically, the semiconductor device transceives data to and/or from another semiconductor device in synchronization with a clock signal. As data input/output (I/O) speed required by the semiconductor device increases, a double data rate (DDR) method may be used. In the DDR method, the data I/O speed is doubled in a way that data are respectively transferred at both a rising edge and a falling edge of a clock signal, and thus a duty cycle of the clock signal, which indicates a ratio of a logic low level interval of the clock signal to a logic high level interval of the clock signal, is one of factors for improving performance of the semiconductor device.

SUMMARY

Exemplary embodiments may address at least the above problems and/or disadvantages and other disadvantages not described above. Also, the exemplary embodiments are not required to overcome the disadvantages described above, and an exemplary embodiment may not overcome any of the problems described above.

One or more exemplary embodiments provide a digital duty cycle correction circuit capable of compensating a duty cycle of a clock signal more precisely and effectively.

According to an aspect of an exemplary embodiment, a digital duty cycle correction circuit includes a duty cycle controller and a digital duty control code generator. The duty cycle controller generates a first output clock signal and a second output clock signal by compensating a duty cycle of a first input clock signal and a duty cycle of a second input clock signal based on a digital duty control code. The first and second input clock signals are a pair of differential signals. The first and second output clock signals are a pair of differential signals. The digital duty control code generator generates the digital duty control code based on a frequency value obtained by converting duty cycle information of the first output clock signal and the second output clock signal.

The digital duty control code generator may include a monitor, a voltage-frequency converter, a frequency counter, and a digital state machine. The monitor may generate a first direct current (DC) voltage and a second DC voltage by monitoring the first output clock signal and the second output clock signal. The voltage-frequency converter may generate a reference frequency signal, a first frequency signal and a second frequency signal by performing a voltage-frequency conversion on a reference voltage, the first DC voltage and the second DC voltage. The frequency counter may generate a reference count value, a first count value and a second count value by counting pulses of the reference frequency signal, pulses of the first frequency signal and pulses of the second frequency signal. The digital state machine may generate the digital duty control code based on the reference count value, the first count value and the second count value.

The digital duty control code may include an up code and a down code. The duty cycle controller may include an amplifier, a first duty cycle correction buffer and a second duty cycle correction buffer. The amplifier may amplify the first input clock signal and the second input clock signal. The first duty cycle correction buffer may generate the first output clock signal by compensating a duty cycle of the amplified first input clock signal based on the up code and the down code. The second duty cycle correction buffer may generate the second output clock signal by compensating a duty cycle of the amplified second input clock signal based on the up code and the down code.

The first duty cycle correction buffer may include a plurality of correction buffers and an inverter. Each of the plurality of correction buffers may be connected to a first node and a second node. The first node may receive the amplified first input clock signal. The inverter may generate the first output clock signal by inverting a voltage at the second node.

Each of the plurality of correction buffers may include a first p-type metal oxide semiconductor (PMOS) transistor, a second PMOS transistor, a first n-type metal oxide semiconductor (NMOS) transistor and a second NMOS transistor. The first PMOS transistor may have a first terminal configured to receive a power supply voltage, a gate terminal and a second terminal. The second PMOS transistor may have a first terminal connected to the second terminal of the first PMOS transistor, a gate terminal connected to the first node and a second terminal connected to the second node. The first NMOS transistor may have a first terminal connected to the second node, a gate terminal connected to the first node and a second terminal. The second NMOS transistor may have a first terminal connected to the second terminal of the first NMOS transistor, a gate terminal and a second terminal configured to receive a ground voltage.

In a first correction buffer of the plurality of correction buffers, the gate terminal of the first PMOS transistor may receive the ground voltage and the gate terminal of the second NMOS transistor may receive the power supply voltage.

In each of the plurality of correction buffers except the first correction buffer, the gate terminal of the first PMOS transistor may receive one bit of the down code and the gate terminal of the second NMOS transistor may receive one bit of the up code.

The monitor may include a first low pass filter and a second low pass filter. The first low pass filter may generate the first DC voltage by low pass filtering the first output clock signal. The second low pass filter may generate the second DC voltage by low pass filtering the second output clock signal.

The voltage-frequency converter may include an analog multiplexer and a voltage controlled oscillator. The analog multiplexer may output one of the reference voltage, the first DC voltage and the second DC voltage based on a selection signal. The voltage controlled oscillator may generate the reference frequency signal, the first frequency signal and the second frequency signal based on an output of the analog multiplexer.

The digital state machine may determine a first correction code by comparing the reference count value with the first count value, may determine a second correction code by comparing the reference count value with the second count value, and may determine the digital duty control code based on the first correction code and the second correction code.

The digital state machine may update the first correction code when a first difference between the reference count value and the first count value is greater than a predetermined tolerance, may maintain the first correction code when the first difference is equal to or less than the predetermined tolerance, may update the second correction code when a second difference between the reference count value and the second count value is greater than the predetermined tolerance, may maintain the second correction code when the second difference is equal to or less than the predetermined tolerance, and may determine the digital duty control code by averaging the first correction code and the second correction code.

The digital duty cycle correction circuit may further include a buffer disposed at a next-stage of the duty cycle controller. The buffer may generate a third output clock signal and a fourth output clock signal by buffering the first output clock signal and the second output clock signal. The third and fourth output clock signals may be a pair of differential signals.

The monitor may further generate a third DC voltage and a fourth DC voltage by monitoring the third output clock signal and the fourth output clock signal. The voltage-frequency converter may further generate a third frequency signal and a fourth frequency signal by performing the voltage-frequency conversion on the third DC voltage and the fourth DC voltage. The frequency counter may further generate a third count value and a fourth count value by counting pulses of the third frequency signal and pulses of the fourth frequency signal. The digital state machine may generate the digital duty control code based on the reference count value, the first count value and the second count value, or based on the reference count value, third count value and the fourth count value.

The digital state machine may include a storage configured to store the digital duty control code. The monitor, the voltage-frequency converter, the frequency counter and the digital state machine except the storage may be disabled after the digital duty control code is determined.

The digital duty control code may be periodically updated after the digital duty control code is determined.

According to an aspect of another exemplary embodiment, a digital duty cycle correction circuit includes a duty cycle controller, a monitor, a voltage-frequency converter, a frequency counter and a digital state machine. The duty cycle controller generates a first output clock signal by compensating a duty cycle of a first input clock signal based on a digital duty control code. The monitor generates a first direct current (DC) voltage by monitoring the first output clock signal. The voltage-frequency converter generates a reference frequency signal and a first frequency signal by performing a voltage-frequency conversion on a reference voltage and the first DC voltage. The frequency counter generates a reference count value and a first count value by counting pulses of the reference frequency signal and pulses of the first frequency signal. The digital state machine generates the digital duty control code based on the reference count value and the first count value.

According to an aspect of still another exemplary embodiment, an integrated circuit device includes a digital duty cycle correction circuit configured to generate an output clock signal by adjusting a duty cycle of the input clock signal based on a digital duty control code corresponding to duty cycle information of the output clock signal and an integrated circuit configured to operate based on the output clock signal.

BRIEF DESCRIPTION OF THE DRAWINGS

The above and/or other aspects will become more apparent by describing certain exemplary embodiments with reference to the accompanied drawings.

DETAILED DESCRIPTION

Figure 1:
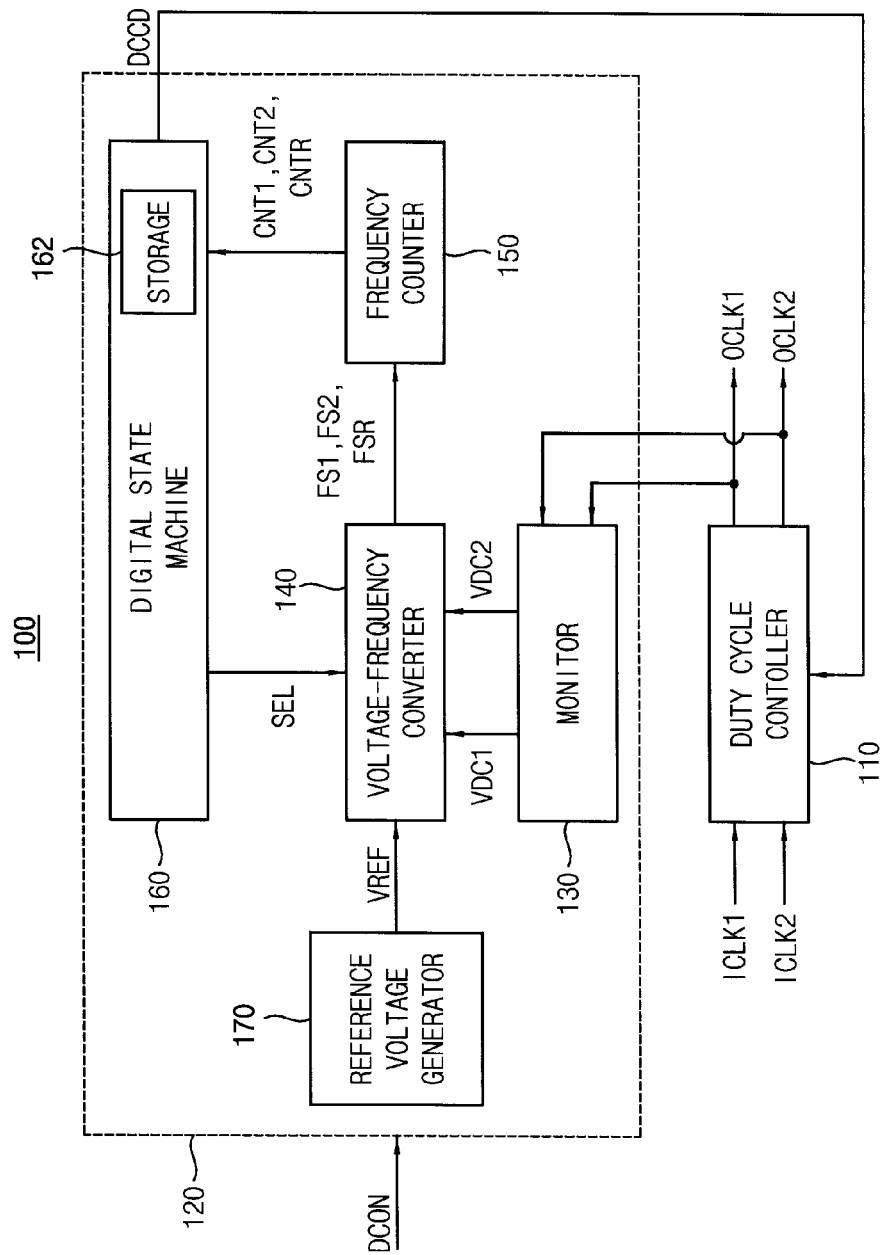
FIG. 1 is a block diagram illustrating a digital duty cycle correction circuit according to an exemplary embodiment.

Certain exemplary embodiments are described in greater detail below with reference to the accompanying drawings. The exemplary embodiments may, however, be embodied in various different forms and should not be construed as limited to the exemplary embodiments set forth herein. Rather, these exemplary embodiments are provided so that this disclosure will be thorough and complete, and will fully convey the scope of the disclosure to those skilled in the art. Like reference numerals refer to like elements throughout this application.

It will be understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of the disclosure. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of the disclosure. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, operations, operations, elements, and/or components, but do not preclude the presence or addition of one or more other.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram illustrating a digital duty cycle correction circuit according to an exemplary embodiment.

Referring to FIG. 1, a digital duty cycle correction circuit 100 includes a duty cycle controller 110 and a digital duty control code generator 120. The digital duty control code generator 120 includes a monitor 130, a voltage-frequency converter 140, a frequency counter 150 and a digital state machine 160. The digital duty control code generator 120 may further include a reference voltage generator 170.

The duty cycle controller 110 generates a first output clock signal OCLK1 and a second output clock signal OCLK2 by compensating a duty cycle of a first input clock signal ICLK1 and a duty cycle of a second input clock signal ICLK2 based on a digital duty control code DCCD. The first and second input clock signals ICLK1 and ICLK2 are a pair of differential signals, and the first and second output clock signals OCLK1 and OCLK2 are a pair of differential signals. The first and second input clock signals ICLK1 and ICLK2 may be generated from an external clock generation circuit (not illustrated), e.g., a phase locked loop (PLL). The first and second output clock signals OCLK1 and OCLK2 may have a duty cycle of about 50:50, respectively. The first and second output clock signals OCLK1 and OCLK2 may be provided to various functional circuits (not illustrated), and the various functional circuits may operate based on at least one of the first and second output clock signals OCLK1 and OCLK2.

The digital duty control code generator 120 generates the digital duty control code DCCD that is used for performing a duty cycle correction operation based on the first and second output clock signals OCLK1 and OCLK2 and a control signal DCON.

The monitor 130 generates a first direct current (DC) voltage VDC1 and a second DC voltage VDC2 by monitoring the first output clock signal OCLK1 and the second output clock signal OCLK2. As will be described below with reference to FIG. 2, the monitoring operation may correspond to a low pass filtering operation.

The voltage-frequency converter 140 generates a reference frequency signal FSR, a first frequency signal FS1 and a second frequency signal FS2 by performing a voltage-frequency conversion on a reference voltage VREF, the first DC voltage VDC1 and the second DC voltage VDC2. The voltage-frequency converter 140 may operate based on a selection signal SEL.

The frequency counter 150 generates a reference count value CNTR, a first count value CNT1 and a second count value CNT2 by counting pulses of the reference frequency signal FSR, pulses of the first frequency signal FS1 and pulses of the second frequency signal FS2.

The digital state machine 160 generates the digital duty control code DCCD based on the reference count value CNTR, the first count value CNT1 and the second count value CNT2. For example, the digital state machine 160 may compare the reference count value CNTR with the first count value CNT1, may compare the reference count value CNTR with the second count value CNT2, and may generate the digital duty control code DCCD based on the comparison results. In addition, the digital state machine 160 may generate the selection signal SEL to be provided to the voltage-frequency converter 140.

The digital state machine 160 may include a storage 162. The storage 162 may store the reference count value CNTR, the first count value CNT1, the second count value CNT2, the comparison results therebetween, and the digital duty control code DCCD. For example, the storage 162 may be implemented with a volatile memory device such as, for example, a dynamic random access memory (DRAM), a static random access memory (SRAM) or a mobile DRAM, and/or a non-volatile memory device such as, for example, an electrically erasable programmable read-only memory (EEPROM), a flash memory, a phase change random access memory (PRAM), a resistance random access memory (PRAM), a nano floating gate memory (NFGM), a polymer random access memory (PoRAM), a magnetic random access memory (MRAM) or a ferroelectric random access memory (FRAM).

The reference voltage generator 170 may generate the reference voltage VREF. For example, a level of the reference voltage VREF may correspond to a half of a level of a power supply voltage VDD (e.g., VDD/2).

As will be described below with reference to FIGS. 3A and 3B, the digital duty control code DCCD may include a first correction code, which is used for adjusting a duty cycle of the first output clock signal OCLK1, and a second correction code, which is used for adjusting a duty cycle of the second output clock signal OCLK2. In addition, the digital duty control code DCCD may include an up code, which is used for increasing the duty cycles of the first and second output clock signals OCLK1 and OLK2, and a down code, which is used for decreasing the duty cycles of the first and second output clock signals OCLK1 and OLK2.

In an exemplary embodiment, the digital duty control code DCCD may be determined in an initial operation time of the digital duty cycle correction circuit 100. For example, in the initial operation time of the digital duty cycle correction circuit 100, elements of the digital duty control code generator 120 (e.g., the monitor 130, the voltage-frequency converter 140, the frequency counter 150, the digital state machine 160 and the reference voltage generator 170) may be enabled based on the control signal DCON, and the digital duty control code DCCD may be determined and stored in the storage 162. After the initial operation time of the digital duty cycle correction circuit 100 elapses, e.g., after the digital duty control code DCCD is determined, the digital duty control code generator 120 except the storage 162 (e.g., the monitor 130, the voltage-frequency converter 140, the frequency counter 150, the digital state machine 160 except the storage 162 and the reference voltage generator 170) may be disabled, and the duty cycle correction operation may be performed based on the digital duty control code DCCD provided from the storage 162. Thus, the digital duty cycle correction circuit 100 may have relatively low power consumption, and jitter noises in the output clock signals OCLK1 and OCLK2 may be reduced.

In another exemplary embodiment, the digital duty control code DCCD may be determined in the initial operation time of the digital duty cycle correction circuit 100 and may be periodically updated after the initial operation time of the digital duty cycle correction circuit 100. For example, after the initial operation time of the digital duty cycle correction circuit 100, elements of the digital duty control code generator 120 (e.g., the monitor 130, the voltage-frequency converter 140, the frequency counter 150, the digital state machine 160 and the reference voltage generator 170) may be periodically enabled, and the digital duty control code DCCD may be updated and stored in the storage 162.

In the digital duty cycle correction circuit 100 according to an exemplary embodiment, duty cycle information of a clock signal is converted into a frequency value, and a duty cycle of the clock signal may be compensated based on a digital code corresponding to the frequency value. Particularly, the digital duty cycle correction circuit 100 includes the monitor 130, the voltage-frequency converter 140 and the frequency counter 150 to convert the duty cycles of the output clock signals OCLK1 and OCLK2 into the count values CNT1 and CNT2 corresponding to frequency values. The digital duty cycle correction circuit 100 includes the digital state machine 160 to generate the digital duty control code DCCD. In comparison with a conventional duty cycle correction circuit including an analog feedback loop, the digital duty cycle correction circuit 100 including a digital feedback loop may perform the duty cycle correction operation more stably and effectively. In addition, the digital duty control code generator 120 except the storage 162 may be disabled after the digital duty control code DCCD is determined, and thus the digital duty cycle correction circuit 100 may have relatively low power consumption.

Figure 2:
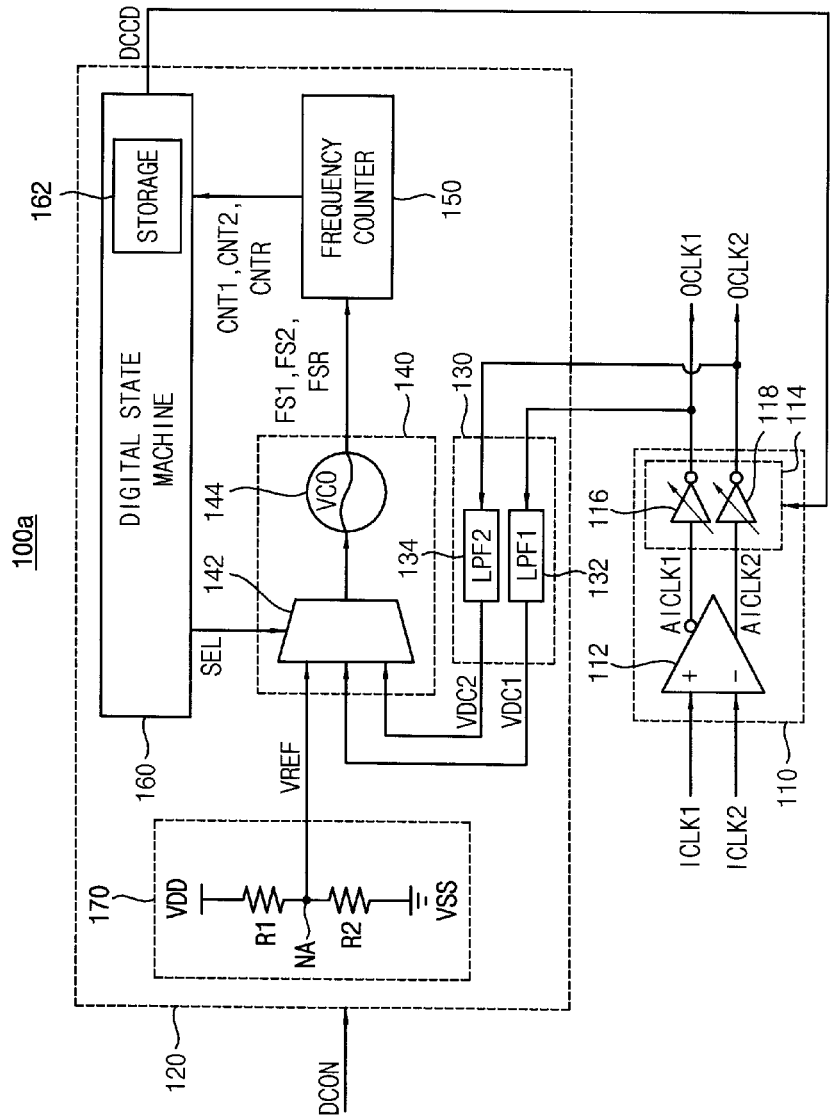
FIG. 2 is a schematic circuit diagram illustrating an example of the digital duty cycle correction circuit of FIG. 1.

FIG. 2 is a diagram illustrating an example of the digital duty cycle correction circuit of FIG. 1. FIGS. 3A and 3B are circuit diagrams illustrating examples of duty cycle correction buffers included in the digital duty cycle correction circuit of FIG. 2. FIG. 4 is a diagram for describing an operation of the digital duty cycle correction circuit of FIG. 2.

Referring to FIG. 2, a digital duty cycle correction circuit 100a includes a duty cycle controller 110 and a digital duty control code generator 120. The digital duty control code generator 120 includes a monitor 130, a voltage-frequency converter 140, a frequency counter 150 and a digital state machine 160. The digital duty control code generator 120 may further include a reference voltage generator 170.

The duty cycle controller 110 may include an amplifier 112 and a duty cycle correction buffer 114.

The amplifier 112 may amplify the first input clock signal ICLK1 and the second input clock signal ICLK1 to generate an amplified first input clock signal AICLK1 and an amplified second input clock signal AICLK2.

The duty cycle correction buffer 114 may generate the first output clock signal OCLK1 and the second output clock signal OCLK2 by compensating a duty cycle of the amplified first input clock signal AICLK1 and a duty cycle of the amplified second input clock signal AICLK2 based on the digital duty control code DCCD. The duty cycle correction buffer 114 may include a first duty cycle correction buffer 116 and a second duty cycle correction buffer 118.

Figure 3A:
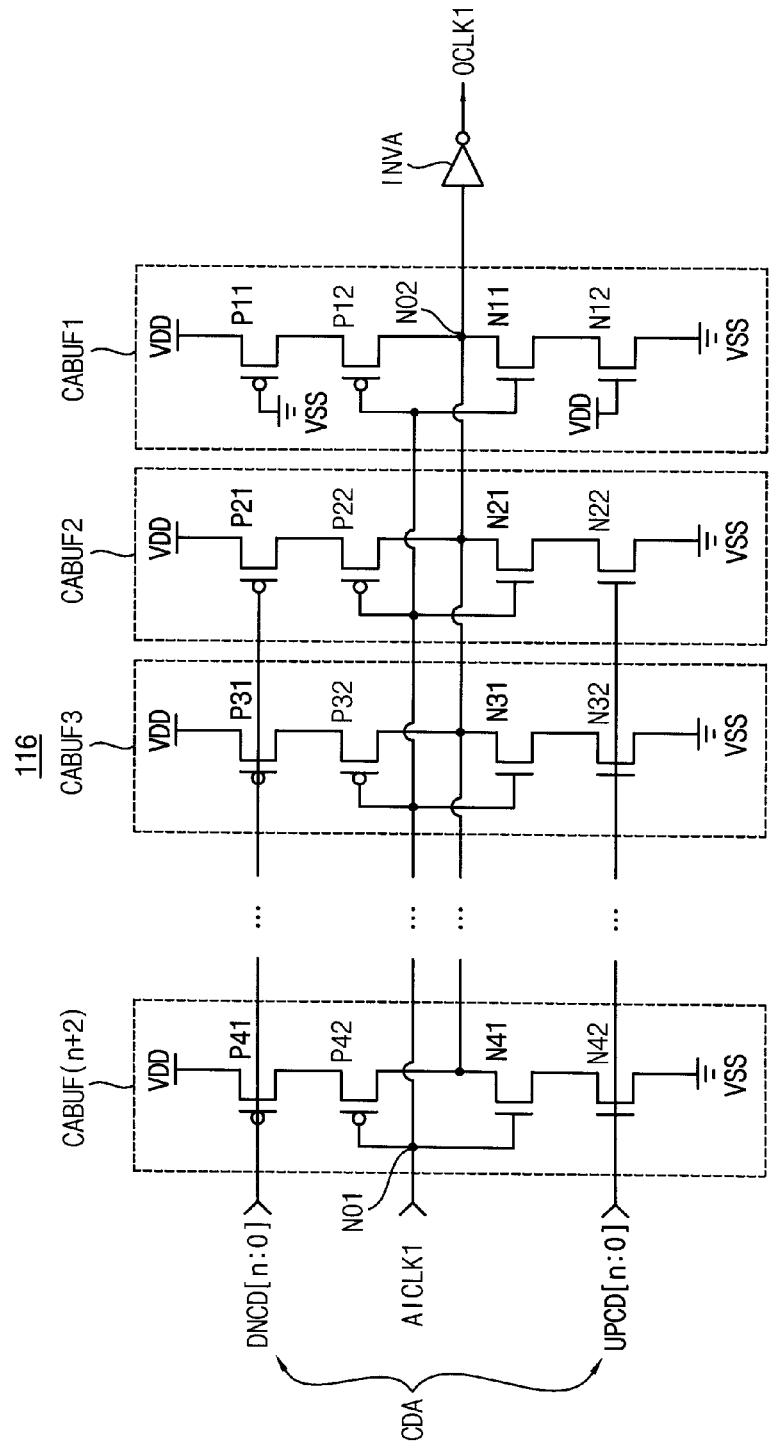
FIGS. 3A and 3B are circuit diagrams illustrating examples of duty cycle correction buffers included in the digital duty cycle correction circuit of FIG. 2.
Figure 3B:
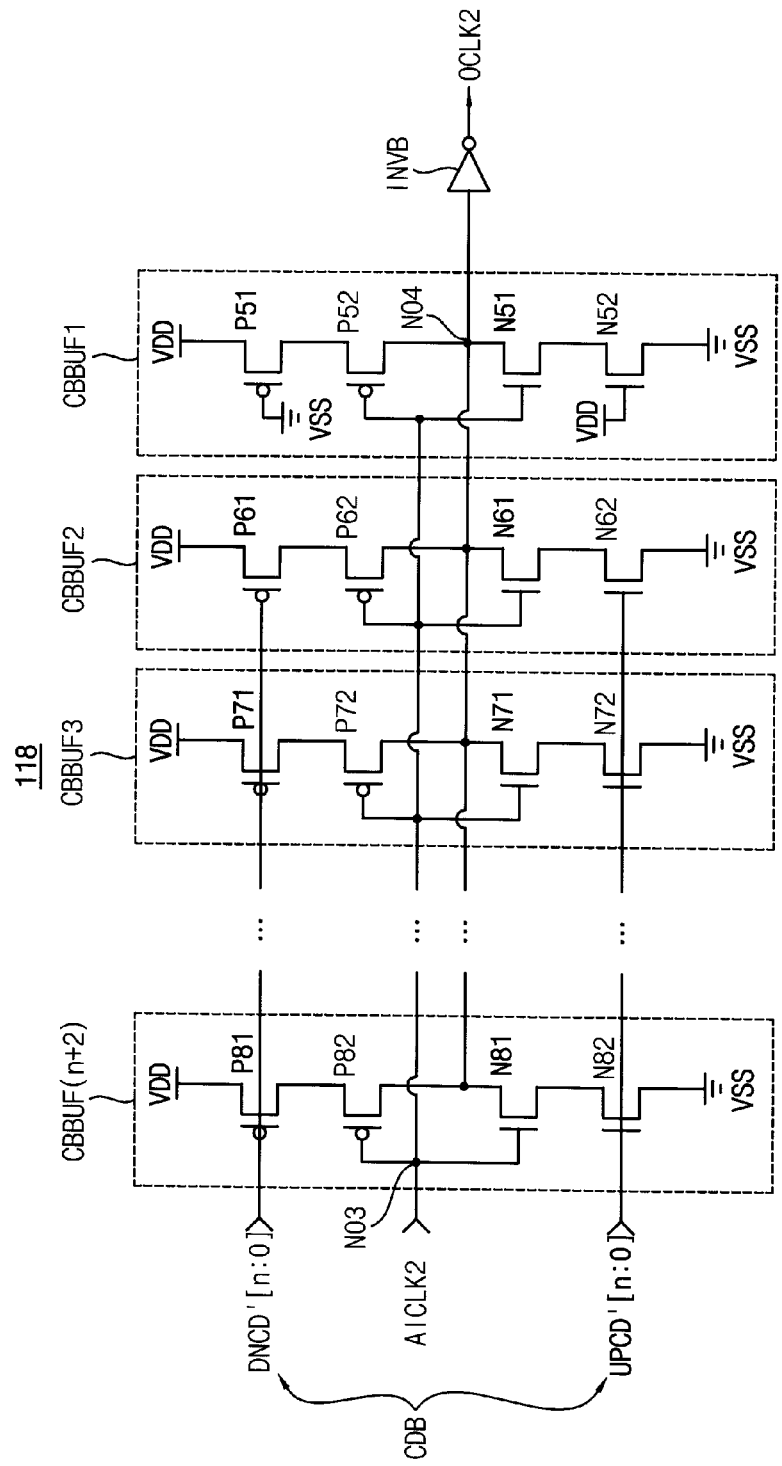
Figure 4:
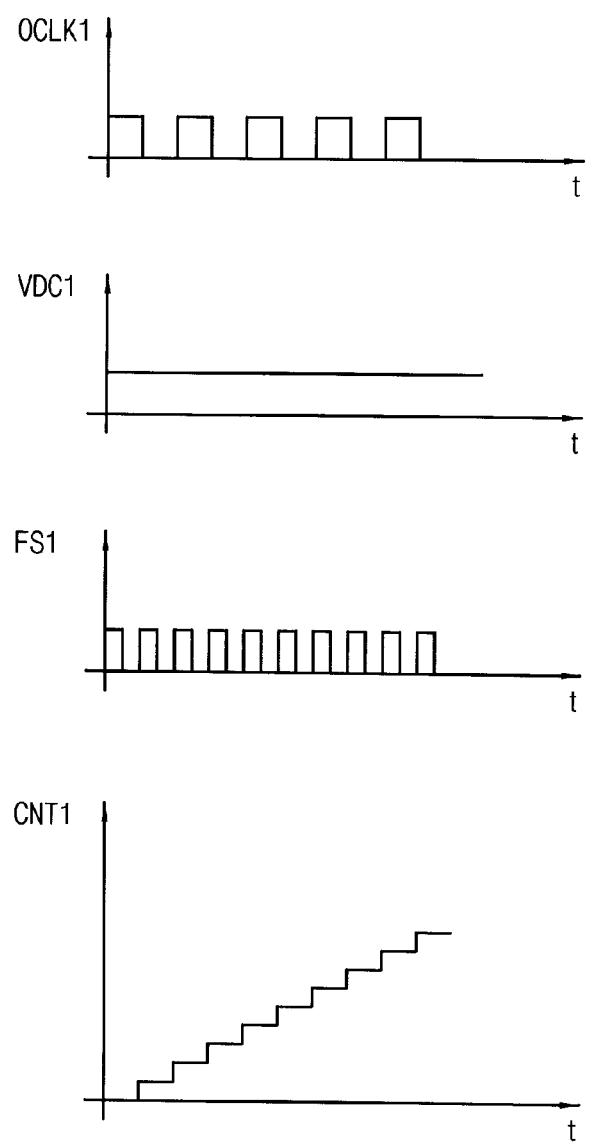
FIG. 4 is a diagram for describing an operation of the digital duty cycle correction circuit of FIG. 2.

Referring to FIGS. 3A and 3B, the digital duty control code DCCD may include a first correction code CDA and a second correction code CDB. The first correction code CDA may include an up code UPCD[n:0] and a down code DNCD[n:0]. The second correction code CDB may include an up code UPCD'[n:0] and a down code DNCD'[n:0]. Typically, a value of the up code UPCD[n:0] may be substantially the same as a value of the up code UPCD'[n:0]. However, the value of the up code UPCD[n:0] and/or the value of the up code UPCD'[n:0] may be changed due to processes, voltages and temperatures (PVT), and the value of the up code UPCD[n:0] may be different from the value of the up code UPCD'[n:0]. Similarly, a value of the down code DNCD[n:0] may be substantially the same as a value of the down code DNCD'[n:0], however, the value of the down code DNCD[n:0] and/or the value of the down code DNCD'[n:0] may be changed due to the PVT.

The first duty cycle correction buffer 116 may generate the first output clock signal OCLK1 by compensating the duty cycle of the amplified first input clock signal AICLK1 based on the up code UPCD[n:0] and the down code DNCD[n:0]. The second duty cycle correction buffer 118 may generate the second output clock signal OCLK2 by compensating the duty cycle of the amplified second input clock signal AICLK2 based on the up code UPCD'[n:0] and the down code DNCD'[n:0].

The first duty cycle correction buffer 116 may include a plurality of correction buffers CABUF1, CABUF2, CABUF3, ..., CABUF(n+2) and an inverter INVA. Each of the plurality of correction buffers CABUF1, ..., CABUF(n+2) may be connected to a first node NO1 and a second node NO2. The first node NO1 may receive the amplified first input clock signal AICLK1. The inverter INVA may generate the first output clock signal OCLK1 by inverting a voltage at the second node NO2.

Each of the plurality of correction buffers CABUF1, ..., CABUF(n+2) may include two p-type metal oxide semiconductor (PMOS) transistors and two n-type metal oxide semiconductor (NMOS) transistors that are cascaded-connected. For example, a first correction buffer CABUF1 may include PMOS transistors P11 and P12 and NMOS transistors N11 and N12 that are cascaded-connected. A first PMOS transistor P11 may have a first terminal configured to receive a power supply voltage VDD, a gate terminal and a second terminal. A second PMOS transistor P12 may have a first terminal connected to the second terminal of the first PMOS transistor P11, a gate terminal connected to the first node NO1 and a second terminal connected to the second node NO2. A first NMOS transistor N11 may have a first terminal connected to the second node NO2, a gate terminal connected to the first node NO1 and a second terminal. A second NMOS transistor N12 may have a first terminal connected to the second terminal of the first NMOS transistor N11, a gate terminal and a second terminal configured to receive a ground voltage VSS. Similarly, a second correction buffer CABUF2 may include transistors P21, P22, N21 and N22 that are cascaded-connected, a third correction buffer CABUF3 may include transistors P31, P32, N31 and N32 that are cascaded-connected, and a (n+2)-th correction buffer CABUF(n+2) may include transistors P41, P42, N41 and N42 that are cascaded-connected.

In an exemplary embodiment, in the first correction buffer CABUF1, the gate terminal of the first PMOS transistor P11 may receive the ground voltage VSS and the gate terminal of the second NMOS transistor N12 may receive the power supply voltage VDD. In other words, the first correction buffer CABUF1 may be always turned on, and thus the first output clock signal OCLK1 corresponding to the amplified first input clock signal AICLK1 may be output through the first correction buffer CABUF1 and the inverter INVA.

In an exemplary embodiment, in each of the correction buffers CABUF2, ..., CABUF(n+2) except the first correction buffer CABUF1, a gate terminal of each of first PMOS transistors P21, P31, ..., and P41 may receive one bit of the down code DNCD[n:0] and a gate terminal of each of second NMOS transistors N22, N32, ..., and N42 may receive one bit of the up code UPCD[n:0]. For example, the gate terminal of the first PMOS transistor P21 in the second correction buffer CABUF2 may receive a least significant bit (LSB) of the down code DNCD[n:0]. The gate terminal of the second NMOS transistor N22 in the second correction buffer CABUF2 may receive an LSB of the up code UPCD[n:0]. The gate terminal of the first PMOS transistor P41 in the (n+2)-th correction buffer CABUF(n+2) may receive a most significant bit (MSB) of the down code DNCD[n:0]. The gate terminal of the second NMOS transistor N42 in the (n+2)-th correction buffer CABUF(n+2) may receive an MSB of the up code UPCD[n:0]. In other words, each of the second through (n+2)-th correction buffers CABUF2, ..., CABUF(n+2) may be selectively turned on depending on a value of the up code UPCD[n:0] and a value of the down code DNCD[n:0], and the duty cycle correction operation on the amplified first input clock signal AICLK1 varies depending on whether each of the correction buffers CABUF2, ..., CABUF(n+2) is turned on.

The second duty cycle correction buffer 118 may have a configuration that is substantially the same as the configuration of the first duty cycle correction buffer 116. For example, the second duty cycle correction buffer 118 may include a plurality of correction buffers CBBUF1, CBBUF2, CBBUF3, ..., CBBUF(n+2) and an inverter INVB. Each of the plurality of correction buffers CBBUF1, ..., CBBUF(n+2) may be connected to a first node NO3 and a second node NO4. The first node NO3 may receive the amplified second input clock signal AICLK2. The inverter INVB may generate the second output clock signal OCLK2 by inverting a voltage at the second node NO4.

The plurality of correction buffers CBBUF1, ..., CBBUF(n+2) may include two of PMOS transistors P51, P52, P61, P62, P71, P72, ..., P81 and P82 and two of NMOS transistors N51, N52, N61, N62, N71, N72, ..., N81 and N82, respectively. In a first correction buffer CBBUF1, a gate terminal of a first PMOS transistor P51 may receive the ground voltage VSS and a gate terminal of a second NMOS transistor N52 may receive the power supply voltage VDD. In each of the correction buffers CBBUF2, ..., CBBUF(n+2) except the first correction buffer CBBUF1, a gate terminal of each of first PMOS transistors P61, P71, ..., and P81 may receive one bit of the down code DNCD'[n:0] and a gate terminal of each of second NMOS transistors N62, N72, ..., and N82 may receive one bit of the up code UPCD'[n:0].

Referring back to FIG. 2, the monitor 130 may include a first low pass filter 132 and a second low pass filter 134. The first low pass filter 132 may generate the first DC voltage VDC1 by low pass filtering the first output clock signal OCLK1. The second low pass filter 134 may generate the second DC voltage VDC2 by low pass filtering the second output clock signal OCLK2.

The reference voltage generator 170 may include a first resistor R1 and a second resistor R2. The first resistor R1 may be connected between the power supply voltage VDD and a node NA. The second resistor R2 may be connected between the node NA and the ground voltage VSS. A voltage at the node NA may be output as the reference voltage VREF. For example, when a resistance of the first resistor R1 is substantially the same as a resistance of the second resistor R2, a level of the reference voltage VREF may correspond to a half of the level of the power supply voltage VDD.

The voltage-frequency converter 140 may include an analog multiplexer 142 and a voltage controlled oscillator 144. The analog multiplexer 142 may output one of the reference voltage VREF, the first DC voltage VDC1 and the second DC voltage VDC2 based on the selection signal SEL. The voltage controlled oscillator 144 may generate the reference frequency signal FSR, the first frequency signal FS1 and the second frequency signal FS2 based on the output of the analog multiplexer 142. For example, the analog multiplexer 142 may output the reference voltage VREF based on the selection signal SEL, and the voltage controlled oscillator 144 may generate the reference frequency signal FSR based on the reference voltage VREF output from the analog multiplexer 142. In addition, the analog multiplexer 142 may output the first DC voltage VDC1 or the second DC voltage VDC2 based on the selection signal SEL, and the voltage controlled oscillator 144 may generate the first frequency signal FS1 or the second frequency signal FS2 based on the first DC voltage VDC1 or the second DC voltage VDC2 output from the analog multiplexer 142.

The frequency counter 150 may perform a counting operation on each rising edge of the reference frequency signal FSR, the first frequency signal FS1 and the second frequency signal FS2, or each falling edge of the reference frequency signal FSR, the first frequency signal FS1 and the second frequency signal FS2.

Referring to FIG. 4, the first output clock signal OCLK1 generated from the duty cycle controller 110 may be converted into the first DC voltage VDC1 based on the operation of the monitor 130. The first DC voltage VDC1 may be converted into the first frequency signal FS1 based on the operation of the voltage-frequency converter 140. The first frequency signal FS1 may be converted into the first count value CNT1 based on the frequency counter 150. Although not illustrated in FIG. 4, the second output clock signal OCLK2 generated from the duty cycle controller 110 may be converted into the second DC voltage VDC2 based on the operation of the monitor 130. The second DC voltage VDC2 may be converted into the second frequency signal FS2 based on the operation of the voltage-frequency converter 140. The second frequency signal FS2 may be converted into the second count value CNT2 based on the frequency counter 150.

Referring back to FIG. 2, the digital state machine 160 may determine the first correction code CDA by comparing the reference count value CNTR with the first count value CNT1, may determine the second correction code CDB by comparing the reference count value CNTR with the second count value CNT2, and may determine the digital duty control code DCCD based on the first correction code CDA and the second correction code CDB. An operation of the digital state machine 160 will be described in detail with reference to FIG. 5.

Typically, a DC value of about VDD/2 may be obtained by low pass filtering a clock signal that has a duty cycle of about 50:50 and toggles between the power supply voltage VDD and the ground voltage VSS. Thus, in the digital duty cycle correction circuit 100a according to an exemplary embodiment, the reference frequency signal FSR and the reference count value CNTR may be generated based on the reference voltage corresponding to about VDD/2. In addition, when the voltage controlled oscillator 144 is used for performing the duty cycle correction operation in the digital duty cycle correction circuit 100a, the duty cycle correction operation may be performed more precisely and the digital duty cycle correction circuit 100a may have improved performance as a gain of the voltage controlled oscillator 144 increases.

Figure 5:
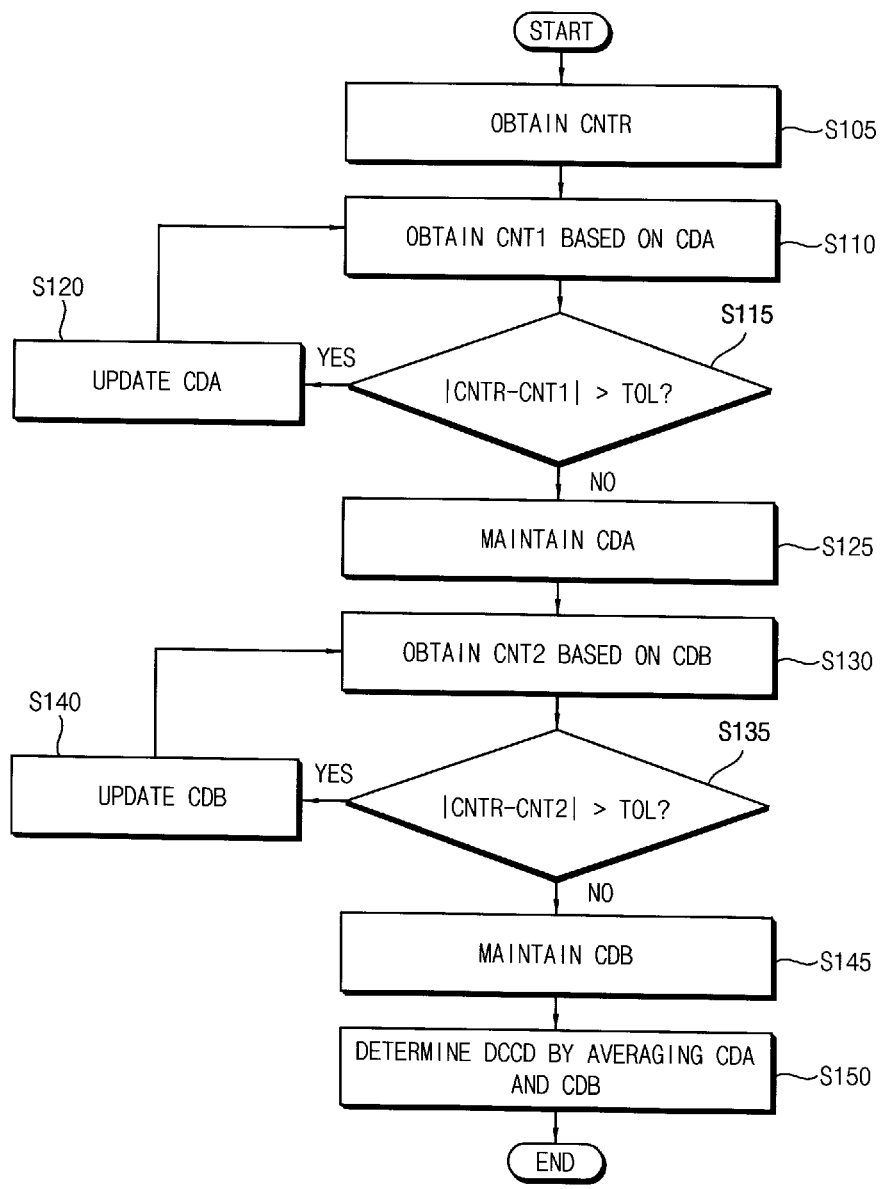
FIG. 5 is a flow chart illustrating a method of operating a digital duty cycle correction circuit according to an exemplary embodiment.

FIG. 5 is a flow chart illustrating a method of operating a digital duty cycle correction circuit according to an exemplary embodiment. FIG. 5 illustrates an operation of the digital duty cycle correction circuit 100a of FIG. 2.

Referring to FIGS. 2 and 5, in the method of operating the digital duty cycle correction circuit 100a, the digital duty control code generator 120 is enabled based on the control signal DCON in an initial operation time of the digital duty cycle correction circuit 100a.

After the digital duty control code generator 120 is enabled, the reference count value CNTR is obtained (operation S105). For example, the reference voltage generator 170 may generate the reference voltage VREF corresponding to about VDD/2. The analog multiplexer 142 may output the reference voltage VREF based on the selection signal SEL. The voltage controlled oscillator 144 may convert the reference voltage VREF output from the analog multiplexer 142 into the reference frequency signal FSR. The frequency counter 150 may generate the reference count value CNTR by counting the pulses of the reference frequency signal FSR. The reference count value CNTR may be stored in the storage 162.

The first count value CNT1 is obtained based on the first correction code CDA (operation S110). For example, the amplifier 112 may amplify the first input clock signal ICLK1. The first duty cycle correction buffer 116 may generate the first output clock signal OCLK1 by compensating the duty cycle of the amplified first input clock signal AICLK1 based on the first correction code CDA having a first initial value. The first low pass filter 132 may generate the first DC voltage VDC1 by low pass filtering the first output clock signal OCLK1. The analog multiplexer 142 may output the first DC voltage VDC1 based on the selection signal SEL. The voltage controlled oscillator 144 may convert the first DC voltage VDC1 output from the analog multiplexer 142 into the first frequency signal FS1. The frequency counter 150 may generate the first count value CNT1 by counting the pulses of the first frequency signal FS1. The first count value CNT1 may also be stored in the storage 162.

The first count value CNT1 is compared with the reference frequency value CNTR (operation S115). When a first difference between the reference count value CNTR and the first count value CNT1 is greater than a predetermined tolerance TOL (operation S115: Yes), the first correction code CDA is updated by the digital state machine 160 (operation S120), and the above mentioned operations S110 and S115 are repeated based on the updated first correction code CDA. When the first difference is equal to or less than the predetermined tolerance TOL (operation S115: No), the first correction code CDA is maintained (operation S125), and a current value of the first correction code CDA is determined as a final value of the first correction code CDA by the digital state machine 160.

Similarly, the second count value CNT2 is obtained based on the second correction code CDB (operation S130). For example, the amplifier 112 may amplify the second input clock signal ICLK2. The second duty cycle correction buffer 118 may generate the second output clock signal OCLK2 by compensating the duty cycle of the amplified second input clock signal AICLK2 based on the second correction code CDB having a second initial value. The second low pass filter 134 may generate the second DC voltage VDC2 by low pass filtering the second output clock signal OCLK2. The analog multiplexer 142 may output the second DC voltage VDC2 based on the selection signal SEL. The voltage controlled oscillator 144 may convert the second DC voltage VDC2 output from the analog multiplexer 142 into the second frequency signal FS2. The frequency counter 150 may generate the second count value CNT2 by counting the pulses of the second frequency signal FS2. The second count value CNT2 may also be stored in the storage 162.

The second count value CNT2 is compared with the reference frequency value CNTR (operation S135). When a second difference between the reference count value CNTR and the second count value CNT2 is greater than the predetermined tolerance TOL (operation S135: Yes), the second correction code CDB is updated by the digital state machine 160 (operation S140), and the above mentioned operations S130 and S135 is repeated based on the updated second correction code CDB. When the second difference is equal to or less than the predetermined tolerance TOL (operation S135: No), the second correction code CDB is maintained (operation S145), and a current value of the second correction code CDB is determined as a final value of the second correction code CDB by the digital state machine 160.

The digital duty control code DCCD is determined by averaging the first correction code CDA and the second correction code CDB by the digital state machine 160 (operation S150). For example, an average up code may be obtained by averaging the up code UPCD[n:0] included in the final value of the first correction code CDA and the up code UPCD'[n:0] included in the final value of the second correction code CDB. An average down code may be obtained by averaging the down code DNCD[n:0] included in the final value of the first correction code CDA and the down code DNCD'[n:0] included in the final value of the second correction code CDB. The average up code and the average down code may be provided as the digital duty control code DCCD. By averaging the up code and the down code, the digital duty control code DCCD may be obtained more precisely and effectively when the up code UPCD[n:0] and the down code DNCD[n:0] are different from the up code UPCD'[n:0] and the down code DNCD'[n:0], respectively, due to the PVT. The digital duty control code DCCD may be stored in the storage 162.

After the digital duty control code DCCD is determined, the digital duty control code generator 120 except the storage 162 is disabled based on the control signal DCON.

Although FIG. 5 illustrates that an operation of determining the first correction code CDA (e.g., operations S110, S115, S120 and S125) and an operation of determining the second correction code CDB (e.g., operations S130, S135, S140 and S145) are sequentially performed, the operation of determining the first correction code CDA and the operation of determining the second correction code CDB may be concurrently performed.

According to an exemplary embodiment, at least a portion of the digital state machine 160 may be implemented as hardware, or may be implemented as software and may be stored in a storage device in a form of program codes that may be executed by a processor (e.g., a microprocessor, a central processing unit (CPU), etc.), to perform the above mentioned operations S115, S120, S125, S135, S140 and S145.

Figure 6:
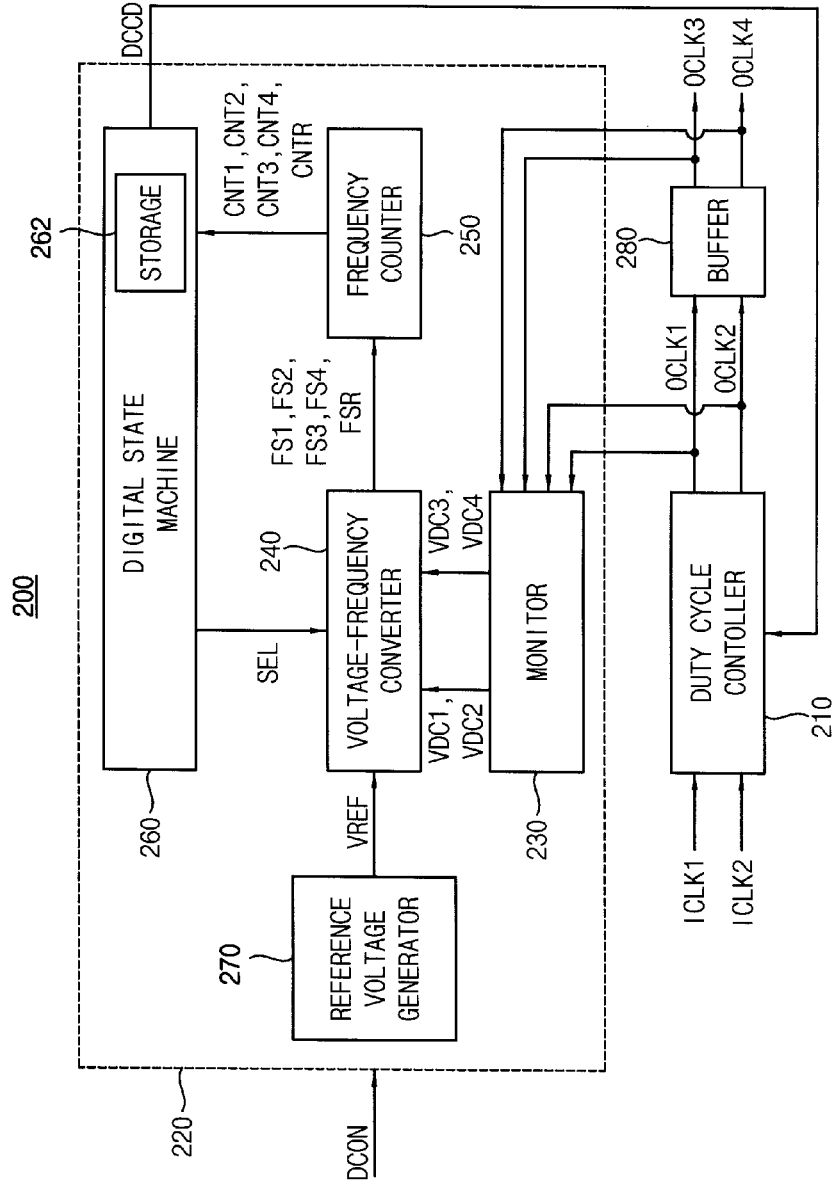
FIG. 6 is a block diagram illustrating a digital duty cycle correction circuit according to another exemplary embodiment.

FIG. 6 is a block diagram illustrating a digital duty cycle correction circuit according to an exemplary embodiment.

Referring to FIG. 6, a digital duty cycle correction circuit 200 includes a duty cycle controller 210 and a digital duty control code generator 220. The digital duty cycle correction circuit 200 may further include a buffer 280. The digital duty control code generator 220 includes a monitor 230, a voltage-frequency converter 240, a frequency counter 250 and a digital state machine 260. The digital duty control code generator 220 may further include a reference voltage generator 270.

In comparison with the digital duty cycle correction circuit 100 of FIG. 1, the digital duty cycle correction circuit 200 of FIG. 6 may further include the buffer 280 disposed at a next-stage of the duty cycle controller 210, and a configuration of the digital duty control code generator 220 may be changed.

The duty cycle controller 210 generates a first output clock signal OCLK1 and a second output clock signal OCLK2 by compensating a duty cycle of a first input clock signal ICLK1 and a duty cycle of a second input clock signal ICLK2 based on a digital duty control code DCCD. The first and second input clock signals ICLK1 and ICLK2 are a pair of differential signals, and the first and second output clock signals OCLK1 and OCLK2 are a pair of differential signals.

The buffer 280 may generate a third output clock signal OCLK3 and a fourth output clock signal OCLK4 by buffering the first output clock signal OCLK1 and the second output clock signal OCLK2. The third and fourth output clock signals OCLK3 and OCLK4 may be a pair of differential signals.

The monitor 230 generates a first direct current (DC) voltage VDC1, a second DC voltage VDC2, a third DC voltage VDC3 and a fourth DC voltage VDC4 by monitoring the first output clock signal OCLK1, the second output clock signal OCLK2, the third output clock signal OCLK3 and the fourth output clock signal OCLK4. The reference voltage generator 270 may generate the reference voltage VREF. The voltage-frequency converter 240 generates a reference frequency signal FSR, a first frequency signal FS1, a second frequency signal FS2, a third frequency signal FS3 and a fourth frequency signal FS4 by performing a voltage-frequency conversion on a reference voltage VREF, the first DC voltage VDC1, the second DC voltage VDC2, the third DC voltage VDC3 and the fourth DC voltage VDC4. The frequency counter 250 generates a reference count value CNTR, a first count value CNT1, a second count value CNT2, a third count value CNT3 and a fourth count value CNT4 by counting pulses of the reference frequency signal FSR, pulses of the first frequency signal FS1, pulses of the second frequency signal FS2, pulses of the third frequency signal FS3 and pulses of the fourth frequency signal FS4.

The digital state machine 260 generates the digital duty control code DCCD based on the reference count value CNTR, the first count value CNT1, the second count value CNT2, the third count value CNT3 and the fourth count value CNT4. For example, the digital state machine 260 may compare the reference count value CNTR with the first count value CNT1, may compare the reference count value CNTR with the second count value CNT2, and may generate the digital duty control code DCCD based on the comparison results. For another example, the digital state machine 260 may compare the reference count value CNTR with the third count value CNT3, may compare the reference count value CNTR with the fourth count value CNT4, and may generate the digital duty control code DCCD based on the comparison results. The digital state machine 260 may include a storage 262.

In the digital duty cycle correction circuit 200 according to an exemplary embodiment, duty cycle information of a clock signal is converted into a frequency value, and a duty cycle of the clock signal may be compensated based on a digital code corresponding to the frequency value. In addition, the digital duty cycle correction circuit 200 may select at least one desired clock signal to perform the duty cycle correction operation. Particularly, the digital duty cycle correction circuit 200 may perform the duty cycle correction operation on the first and second output clock signals OCLK1 and OCLK2 or may perform the duty cycle correction operation on the third and fourth output clock signals OCLK3 and OCLK4. Therefore, the digital duty cycle correction circuit 200 may effectively provide various clock signals each of which has an appropriate (e.g., optimal) duty cycle with respect to each of various operating environments.

Figure 7:
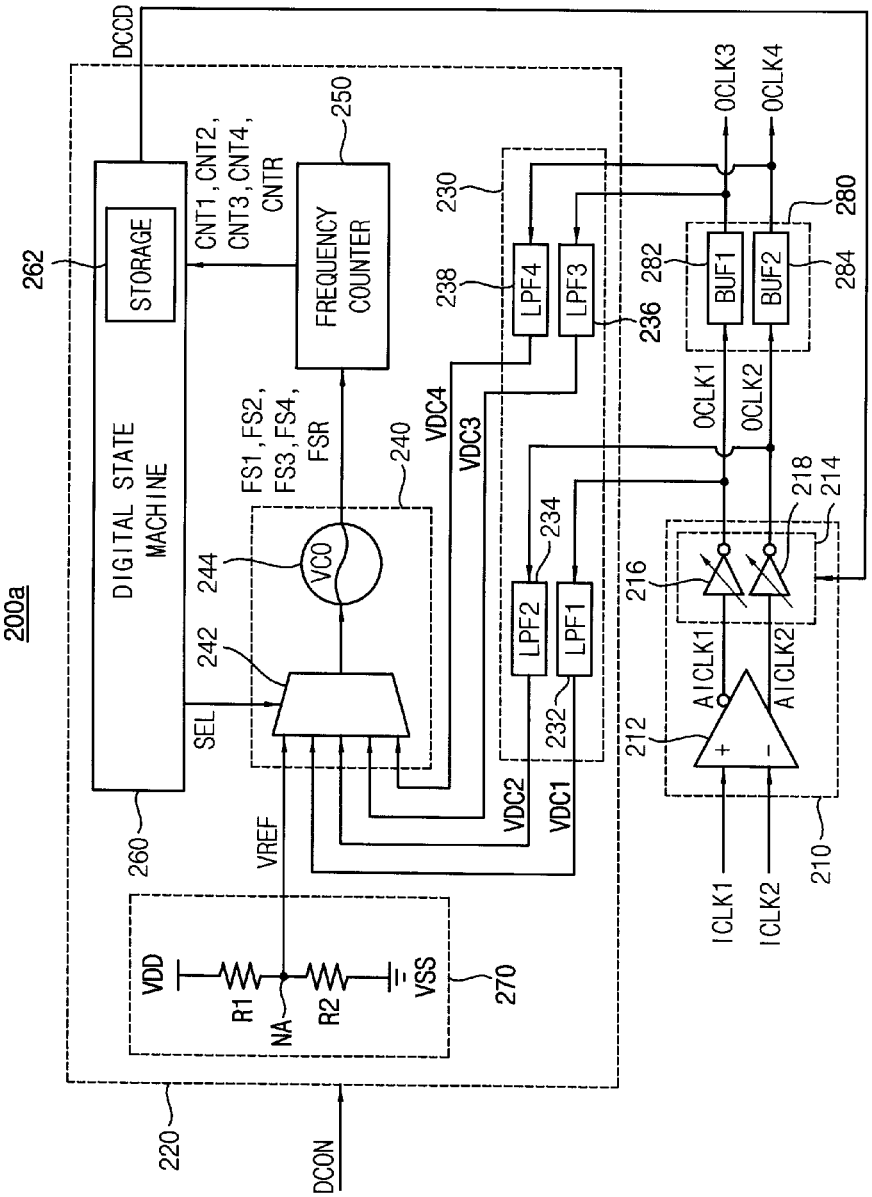
FIG. 7 is a schematic circuit diagram illustrating an example of the digital duty cycle correction circuit of FIG. 6.

FIG. 7 is a diagram illustrating an example of the digital duty cycle correction circuit of FIG. 6.

Referring to FIG. 7, a digital duty cycle correction circuit 200a includes a duty cycle controller 210 and a digital duty control code generator 220. The digital duty cycle correction circuit 200a may further include a buffer 280. The digital duty control code generator 220 includes a monitor 230, a voltage-frequency converter 240, a frequency counter 250 and a digital state machine 260. The digital duty control code generator 220 may further include a reference voltage generator 270.

The duty cycle controller 210 may include an amplifier 212 and a duty cycle correction buffer 214. The duty cycle correction buffer 214 may include a first duty cycle correction buffer 216 and a second duty cycle correction buffer 218. The amplifier 212 may be substantially the same as the amplifier 112 in FIG. 2. The first and second duty cycle correction buffers 216 and 218 may be substantially the same as the first and second duty cycle correction buffers 116 and 118 in FIG. 2, respectively. Also, the first and second duty cycle correction buffers 216 and 218 may have configurations that are substantially the same as the configurations of the first and second duty cycle correction buffers 116 and 118 illustrated in FIGS. 3A and 3B, respectively.

The buffer 280 may include a first buffer 282 and a second buffer 284. The first buffer 282 may generate the third output clock signal OCLK3 by buffering the first output clock signal OCLK1. The second buffer 284 may generate the fourth output clock signal OCLK4 by buffering the second output clock signal OCLK2. Each of the first and second buffers 282 may include a plurality of inverters that are cascaded-connected.

The monitor 230 may include a first low pass filter 232, a second low pass filter 234, a third low pass filter 236 and a fourth low pass filter 238. The first and second low pass filters 232 and 234 may be substantially the same as the first and second low pass filters 132 and 134 in FIG. 2, respectively. The third low pass filter 236 may generate the third DC voltage VDC3 by low pass filtering the third output clock signal OCLK3. The fourth low pass filter 238 may generate the fourth DC voltage VDC4 by low pass filtering the fourth output clock signal OCLK4.

The reference voltage generator 270 may be substantially the same as the reference voltage generator 170 in FIG. 2.

The voltage-frequency converter 240 may include an analog multiplexer 242 and a voltage controlled oscillator 244. The analog multiplexer 242 may output one of the reference voltage VREF, the first DC voltage VDC1, the second DC voltage VDC2, the third DC voltage VDC3 and the fourth DC voltage VDC4 based on the selection signal SEL. The voltage controlled oscillator 244 may generate the reference frequency signal FSR, the first frequency signal FS1, the second frequency signal FS2, the third frequency signal FS3 and the fourth frequency signal FS4 based on the output of the analog multiplexer 242.

The frequency counter 250 may perform a counting operation on each rising edge of the reference frequency signal FSR, the first frequency signal FS1, the second frequency signal FS2, the third frequency signal FS3 and the fourth frequency signal FS4, or each falling edge of the reference frequency signal FSR, the first frequency signal FS1, the second frequency signal FS2, the third frequency signal FS3 and the fourth frequency signal FS4.

In an exemplary embodiment, the digital state machine 260 may determine the first correction code CDA by comparing the reference count value CNTR with the first count value CNT1, may determine the second correction code CDB by comparing the reference count value CNTR with the second count value CNT2, and may determine the digital duty control code DCCD based on the first correction code CDA and the second correction code CDB. In another exemplary embodiment, the digital state machine 260 may determine the first correction code CDA by comparing the reference count value CNTR with the third count value CNT3, may determine the second correction code CDB by comparing the reference count value CNTR with the fourth count value CNT4, and may determine the digital duty control code DCCD based on the first correction code CDA and the second correction code CDB.

Although FIGS. 6 and 7 illustrate that one buffer 280 is disposed at the next-stage of the duty cycle controller 210, a plurality of buffers may be disposed at the next-stage of the duty cycle controller 210, and the digital duty cycle correction circuit may select at least one clock signal that is output from at least one of plurality of buffers to perform the duty cycle correction operation.

Figure 8:
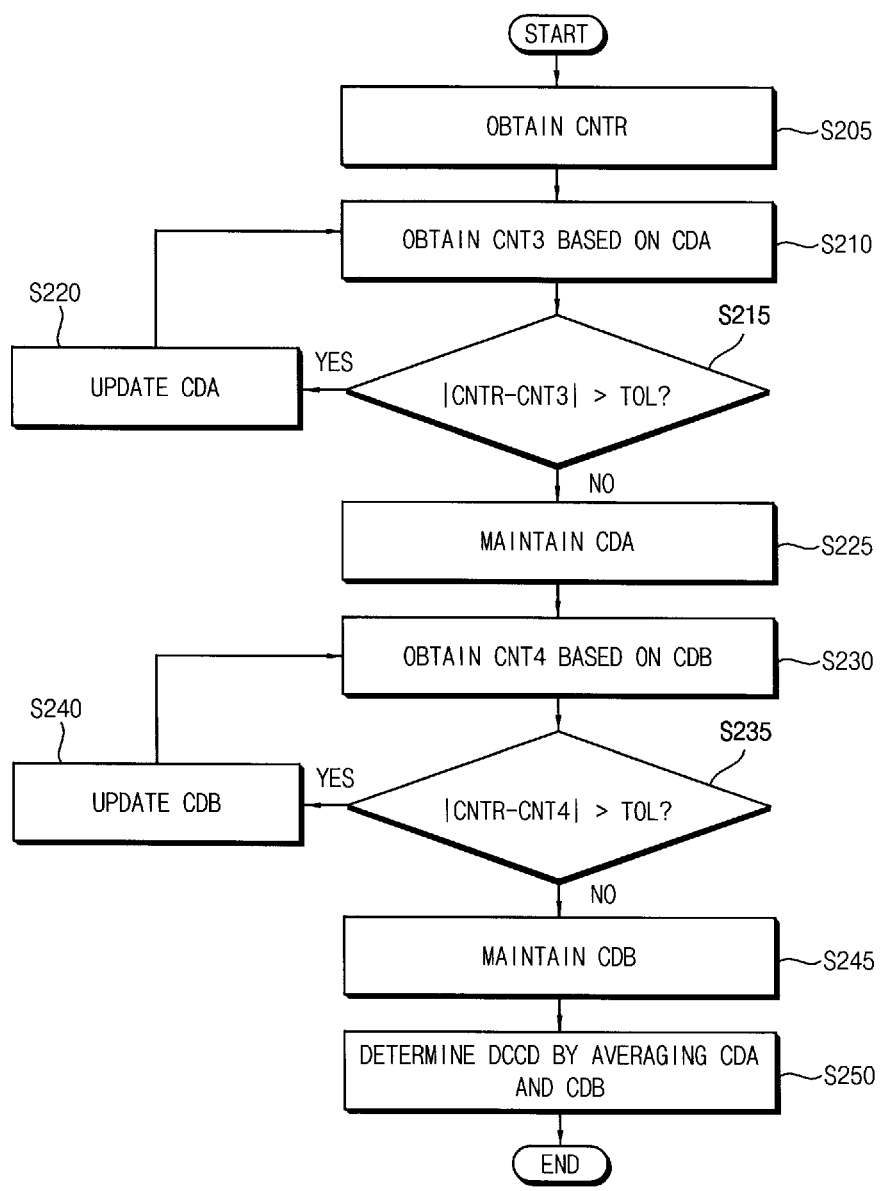
FIG. 8 is a flow chart illustrating a method of operating a digital duty cycle correction circuit according to another exemplary embodiment.

FIG. 8 is a flow chart illustrating a method of operating a digital duty cycle correction circuit according to an exemplary embodiment. FIG. 8 illustrates an operation of the digital duty cycle correction circuit 200a of FIG. 7, and particularly, the duty cycle correction operation on the third and fourth output clock signals OCLK3 and OCLK4. In the digital duty cycle correction circuit 200a of FIG. 7, the duty cycle correction operation on the first and second output clock signals OCLK1 and OCLK2 may be substantially the same as the exemplary embodiment described above with reference to FIG. 5.

Referring to FIGS. 7 and 8, in the method of operating the digital duty cycle correction circuit 200a, the digital duty control code generator 220 is enabled based on the control signal DCON in an initial operation time of the digital duty cycle correction circuit 200a.

After the digital duty control code generator 220 is enabled, the reference count value CNTR is obtained (operation S205). The third count value CNT3 is obtained based on the first correction code CDA (operation S210). The third count value CNT3 is compared with the reference frequency value CNTR (operation S215). When a third difference between the reference count value CNTR and the third count value CNT3 is greater than a predetermined tolerance TOL (operation S215: Yes), the first correction code CDA is updated (operation S220), and the above mentioned operations S210 and S215 are repeated based on the updated first correction code CDA. When the third difference is equal to or less than the predetermined tolerance TOL (operation S215: No), the first correction code CDA is maintained (operation S225), and a current value of the first correction code CDA is determined as a final value of the first correction code CDA.

Similarly, the fourth count value CNT4 is obtained based on the second correction code CDB (operation S230). The fourth count value CNT4 is compared with the reference frequency value CNTR (operation S235). When a fourth difference between the reference count value CNTR and the fourth count value CNT4 is greater than the predetermined tolerance TOL (operation S235: Yes), the second correction code CDB is updated (operation S240), and the above mentioned operations S230 and S235 are repeated based on the updated second correction code CDB. When the fourth difference is equal to or less than the predetermined tolerance TOL (operation S235: No), the second correction code CDA is maintained (operation S245), and a current value of the second correction code CDB is determined as a final value of the second correction code CDB.

The digital duty control code DCCD is determined by averaging the first correction code CDA and the second correction code CDB (operation S250). The digital duty control code DCCD may be stored in the storage 262.

After the digital duty control code DCCD is determined, the digital duty control code generator 220 except the storage 262 is disabled based on the control signal DCON.

Figure 9:
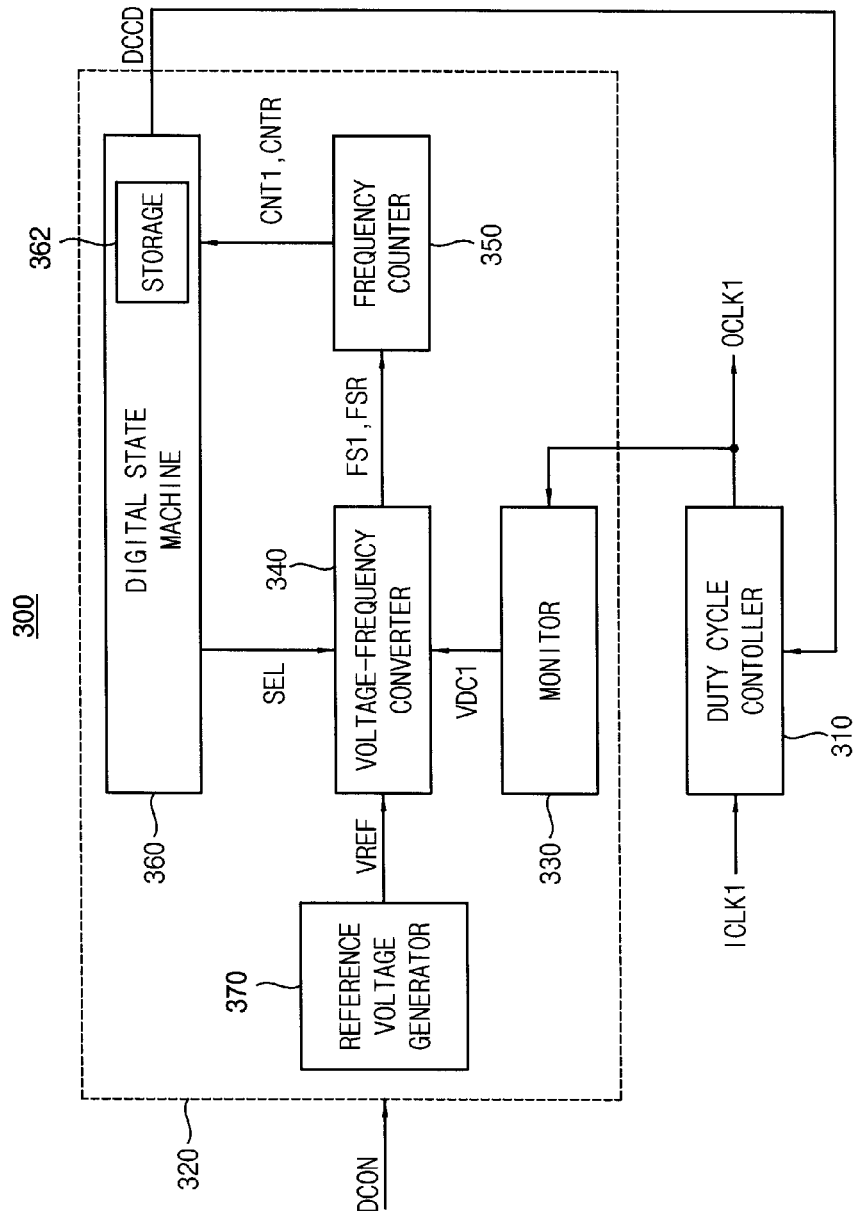
FIG. 9 is a block diagram illustrating a digital duty cycle correction circuit according to still another exemplary embodiment.

FIG. 9 is a block diagram illustrating a digital duty cycle correction circuit according to an exemplary embodiment.

Referring to FIG. 9, a digital duty cycle correction circuit 300 includes a duty cycle controller 310 and a digital duty control code generator 320. The digital duty control code generator 320 includes a monitor 330, a voltage-frequency converter 340, a frequency counter 350 and a digital state machine 360. The digital duty control code generator 320 may further include a reference voltage generator 370.

In comparison with the digital duty cycle correction circuit 100 of FIG. 1, the digital duty cycle correction circuit 300 of FIG. 9 may generate an output clock signal that is not a pair of differential signals but a single signal, and configurations of the duty cycle controller 310 and the digital duty control code generator 320 may be changed.

The duty cycle controller 310 generates a first output clock signal OCLK1 by compensating a duty cycle of a first input clock signal ICLK1 based on a digital duty control code DCCD.

The monitor 330 generates a first direct current (DC) voltage VDC1 by monitoring the first output clock signal OCLK1. The voltage-frequency converter 340 generates a reference frequency signal FSR and a first frequency signal FS1 by performing a voltage-frequency conversion on a reference voltage VREF and the first DC voltage VDC1. The frequency counter 350 generates a reference count value CNTR and a first count value CNT1 by counting pulses of the reference frequency signal FSR and pulses of the first frequency signal FS1. The digital state machine 360 generates the digital duty control code DCCD based on the reference count value CNTR and the first count value CNT1. The digital state machine 360 may include a storage 362.

Figure 10:
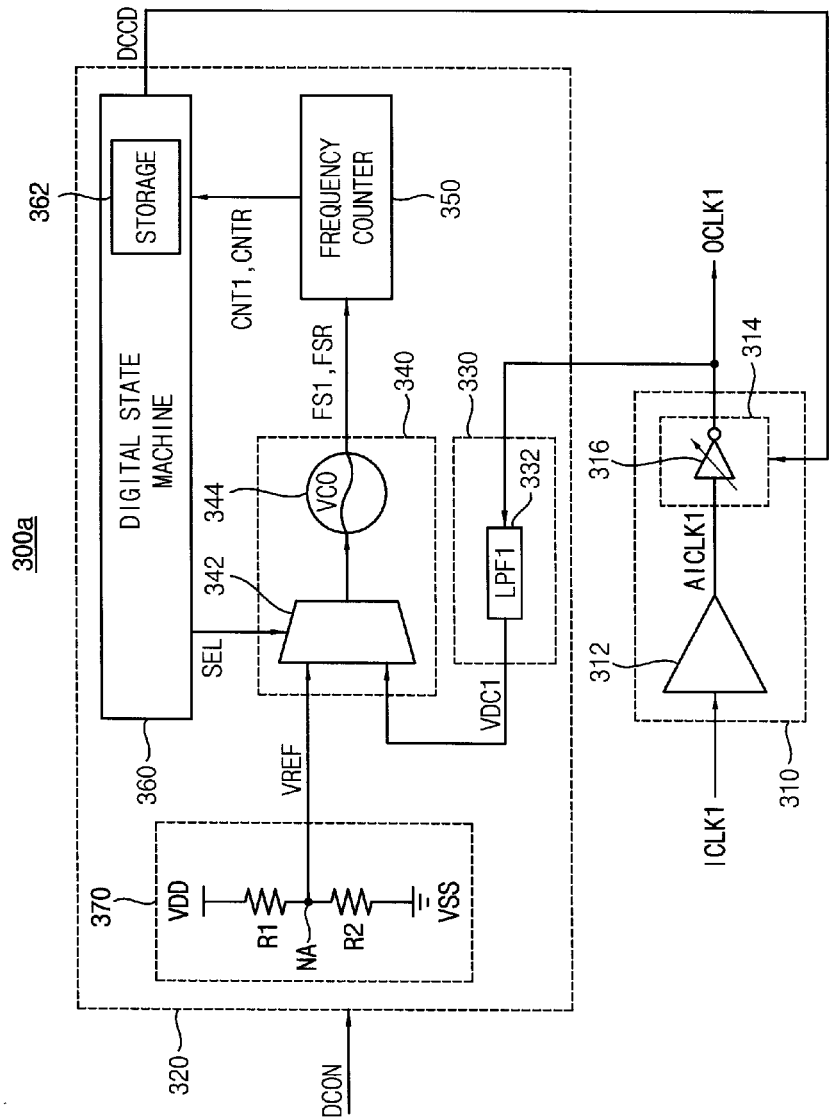
FIG. 10 is a schematic circuit diagram illustrating an example of the digital duty cycle correction circuit of FIG. 9.

FIG. 10 is a diagram illustrating an example of the digital duty cycle correction circuit of FIG. 9.

Referring to FIG. 10, a digital duty cycle correction circuit 300a includes a duty cycle controller 310 and a digital duty control code generator 320. The digital duty control code generator 320 includes a monitor 330, a voltage-frequency converter 340, a frequency counter 350 and a digital state machine 360. The digital duty control code generator 320 may further include a reference voltage generator 370.

The duty cycle controller 310 may include an amplifier 312 and a duty cycle correction buffer 314. The amplifier 312 may amplify the first input clock signal ICLK1 to generate an amplified first input clock signal AICLK1. The duty cycle correction buffer 314 may generate the first output clock signal OCLK1 by compensating a duty cycle of the amplified first input clock signal AICLK1 based on the digital duty control code DCCD. The duty cycle correction buffer 314 may include a first duty cycle correction buffer 316. The first duty cycle correction buffer 316 may be substantially the same as the first duty cycle correction buffer 116 in FIG. 2. Also, the first duty cycle correction buffer 316 may have a configuration that is substantially the same as the configuration of the first duty cycle correction buffer 116 illustrated in FIG. 3A.

The monitor 330 may include a first low pass filter 332. The first low pass filter 332 may be substantially the same as the first low pass filter 132 in FIG. 2. The reference voltage generator 370 may be substantially the same as the reference voltage generator 170 in FIG. 2.

The voltage-frequency converter 340 may include an analog multiplexer 342 and a voltage controlled oscillator 344. The analog multiplexer 342 may output one of the reference voltage VREF and the first DC voltage VDC1 based on the selection signal SEL. The voltage controlled oscillator 344 may generate the reference frequency signal FSR and the first frequency signal FS1 based on the output of the analog multiplexer 342.

The frequency counter 350 may perform a counting operation on each rising edge of the reference frequency signal FSR and the first frequency signal FS1, or each falling edge of the reference frequency signal FSR and the first frequency signal FS1.

The digital state machine 360 may determine the first correction code CDA by comparing the reference count value CNTR with the first count value CNT1, and may determine the digital duty control code DCCD based on the first correction code.

Although not illustrated in FIGS. 9 and 10, at least one buffer may be disposed at a next-stage of the duty cycle controller 310, and the digital duty cycle correction circuit may select at least one clock signal that is output from at least one buffer to perform the duty cycle correction operation.

Figure 11:
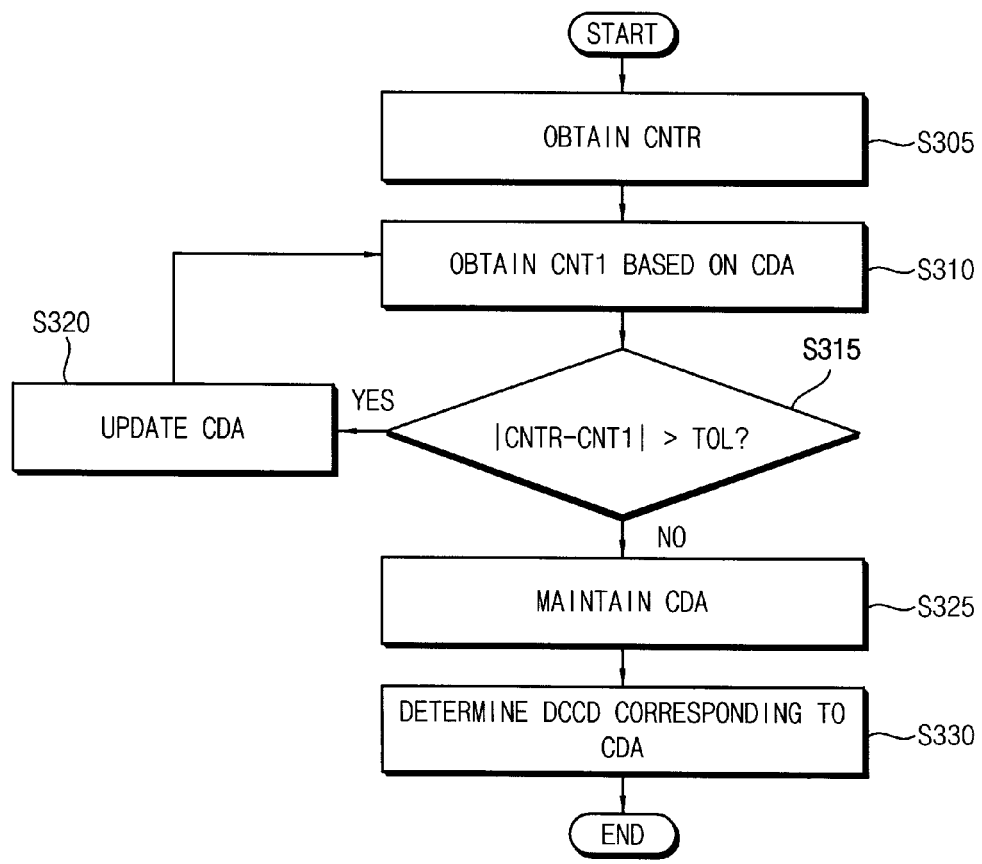
FIG. 11 is a flow chart illustrating a method of operating a digital duty cycle correction circuit according to still another exemplary embodiment.

FIG. 11 is a flow chart illustrating a method of operating a digital duty cycle correction circuit according to an exemplary embodiment. FIG. 11 illustrates an operation of the digital duty cycle correction circuit 300*a* of FIG. 10.

Referring to FIGS. 10 and 11, in the method of operating the digital duty cycle correction circuit 300*a*, the digital duty control code generator 320 is enabled based on the control signal DCON in an initial operation time of the digital duty cycle correction circuit 100*a*.

After the digital duty control code generator 320 is enabled, the reference count value CNTR is obtained (operation S305). The first count value CNT1 is obtained based on the first correction code CDA (operation S310). The first count value CNT1 is compared with the reference frequency value CNTR (operation S315). When a first difference between the reference count value CNTR and the first count value CNT1 is greater than a predetermined tolerance TOL (operation S315: Yes), the first correction code CDA is updated (operation S320), and the above mentioned operations S310 and S315 are repeated based on the updated first correction code CDA. When the first difference is equal to or less than the predetermined tolerance TOL (operation S315: No), the first correction code CDA is maintained (operation S325).

The digital duty control code DCCD corresponding to the first correction code CDA is determined (operation S330). In this case, the digital duty control code DCCD may be substantially the same as the first correction code CDA. The digital duty control code DCCD may be stored in the storage 362.

After the digital duty control code DCCD is determined, the digital duty control code generator 320 except the storage 362 is disabled based on the control signal DCON.

Figure 12:
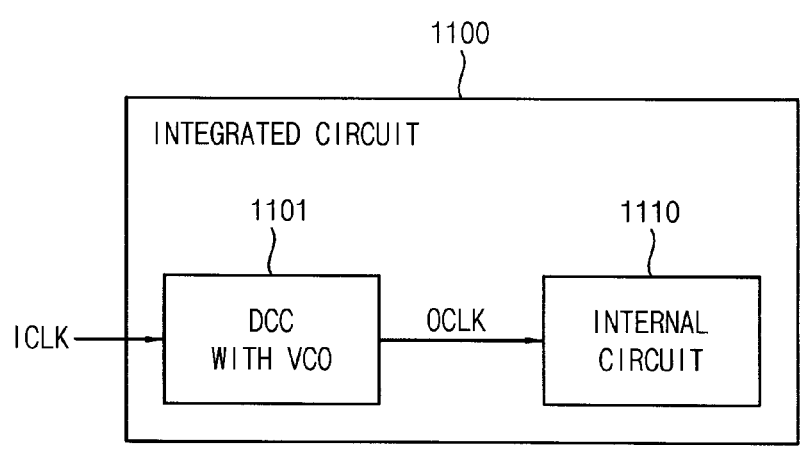
FIG. 12 is a block diagram illustrating an integrated circuit including a digital duty cycle correction circuit according to exemplary embodiments.

FIG. 12 is a block diagram illustrating an integrated circuit including the digital duty cycle correction circuit according to an exemplary embodiment.

Referring to FIG. 12, an integrated circuit 1100 includes a digital duty cycle correction circuit 1101 and an internal circuit 1110.

The digital duty cycle correction circuit 1101 may be one of the digital duty cycle correction circuit 100 of FIG. 1, the digital duty cycle correction circuit 200 of FIG. 6 and the digital duty cycle correction circuit 300 of FIG. 9. The digital duty cycle correction circuit 1101 generates an output clock signal OCLK by compensating a duty cycle of an input clock signal ICLK. The digital duty cycle correction circuit 1101 may include a voltage controlled oscillator. In the digital duty cycle correction circuit 1101, duty cycle information of a clock signal may be converted into a frequency value, and a duty cycle of the clock signal may be compensated based on a digital code corresponding to the frequency value. Thus, the digital duty cycle correction circuit 1101 may perform the duty cycle correction operation more stably and effectively, and the digital duty cycle correction circuit 1101 and the integrated circuit 1100 may have relatively low power consumption.

The internal circuit 1110 may operate or perform various operations based on the output clock signal OCLK from the digital duty cycle correction circuit 1101.

Figure 13:
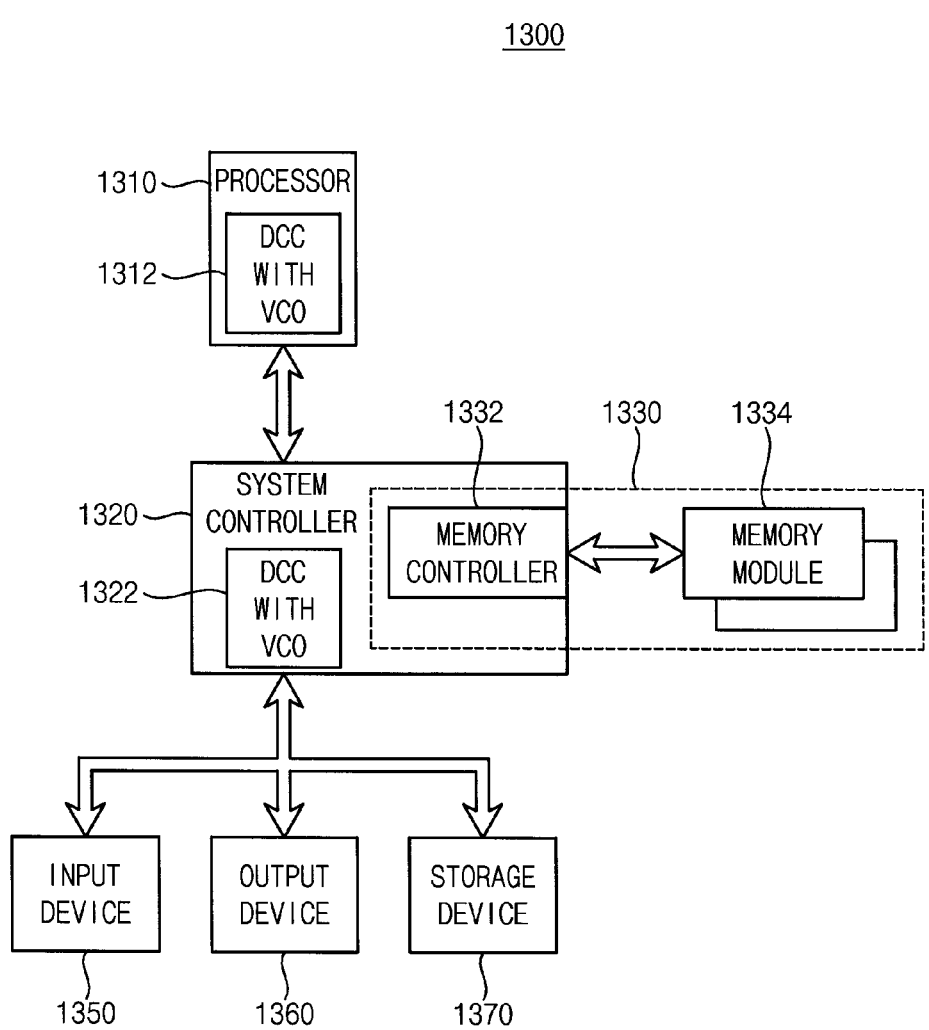
FIG. 13 is a block diagram illustrating a memory system including a digital duty cycle correction circuit according to exemplary embodiments.

FIG. 13 is a block diagram illustrating a memory system including the digital duty cycle correction circuit according to an exemplary embodiment.

Referring to FIG. 13, a memory system 1300 includes a processor 1310, a system controller 1320 and a memory device 1330. The memory system 1300 may further include an input device 1350, an output device 1360 and a storage device 1370.

The memory device 1330 includes a plurality of memory modules 1334 and a memory controller 1332 that controls the plurality of memory modules 1334. The plurality of memory modules 1334 may include at least one volatile memory or at least one nonvolatile memory. The memory controller 1332 may be included in the system controller 1320.

The processor 1310 may execute specific computations or specific tasks. The processor 1310 may communicate with the system controller 1320 through a processor bus. The system controller 1320 may communicate with the input device 1350, the output device 1360 and the storage device 1370 through an expansion bus. Accordingly, the processor 1310 may control the input device 1350, the output device 1360 or the storage device 1370 through the system controller 1320.

The processor 1310 and the system controller 1320 may include a digital duty cycle correction circuit 1312 and a digital duty cycle correction circuit 1322, respectively. Each of the digital duty cycle correction circuits 1312 and 1322 may include a voltage controlled oscillator. In each of the digital duty cycle correction circuits 1312 and 1322, duty cycle information of a clock signal may be converted into a frequency value, and a duty cycle of the clock signal may be compensated based on a digital code corresponding to the frequency value. Thus, the digital duty cycle correction circuits 1312 and 1322 may perform the duty cycle correction operation more stably and effectively, and the digital duty cycle correction circuits 1312 and 1322 and the memory system 1300 may have relatively low power consumption.

Figure 14:
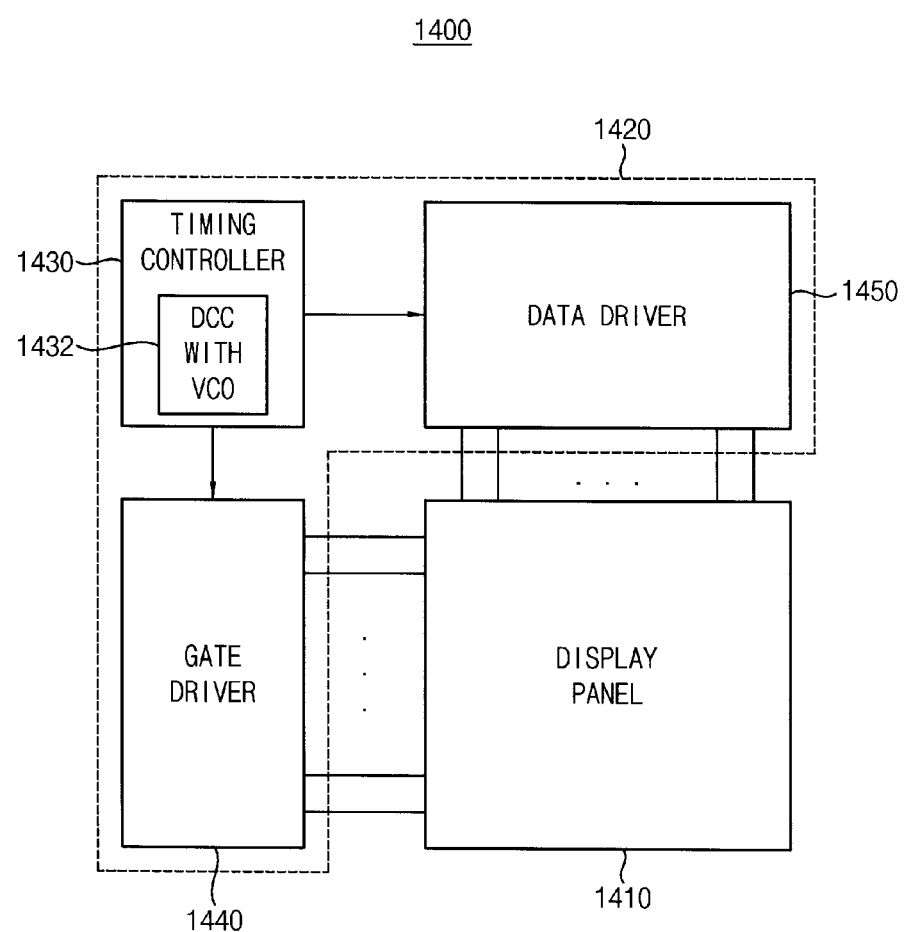
FIG. 14 is a block diagram illustrating a display system including a digital duty cycle correction circuit according to exemplary embodiments.

FIG. 14 is a block diagram illustrating a display system including the digital duty cycle correction circuit according to an exemplary embodiment.

Referring to FIG. 14, a display system 1400 includes a display panel 1410 and a display driver integrated circuit (DDI) 1420.

The display panel 1410 includes a plurality of gate lines and a plurality of data lines. The display panel 1410 includes a pixel array where a plurality of pixels are arranged in a matrix form. Each pixel may be defined by each of the gate lines and each of the data lines intersecting each of the gate lines. The display panel 1410 may include a liquid crystal display (LCD) panel, a light emitting diode (LED) display panel, an organic LED (OLED) display panel, a field emission display (FED) panel, etc.

The DDI 1420 controls an operation of the display panel 1410. The DDI 1420 may include a timing controller 1430, a gate driver 1440 and a data driver 1450.

The timing controller 1430 may generate a gate driver control signal, a data driver control signal and internal data DIN based on image data and a system control signal from an external device (e.g., a graphics processing unit (GPU)). The gate driver 1440 may selectively enable the plurality of gate lines of the display panel 1410 based on the gate driver control signal to select a row of the pixel array. The data driver 1450 may apply a plurality of driving voltages to the plurality of data lines of the display panel 1410 based on the data driver control signal and the internal data DIN. The display panel 1410 may be driven by the gate driver 1440 and the data driver 1450. An image corresponding to the image data may be displayed on the display panel 1410.

The timing controller 1430 may include a digital duty cycle correction circuit 1432. The digital duty cycle correction circuit 1432 may include a voltage controlled oscillator. In the digital duty cycle correction circuit 1432, duty cycle information of a clock signal may be converted into a frequency value, and a duty cycle of the clock signal may be compensated based on a digital code corresponding to the frequency value. Thus, the digital duty cycle correction circuit 1432 may perform the duty cycle correction operation more stably and effectively, and the digital duty cycle correction circuit 1432 and the display system 1400 may have relatively low power consumption.

Figure 15:
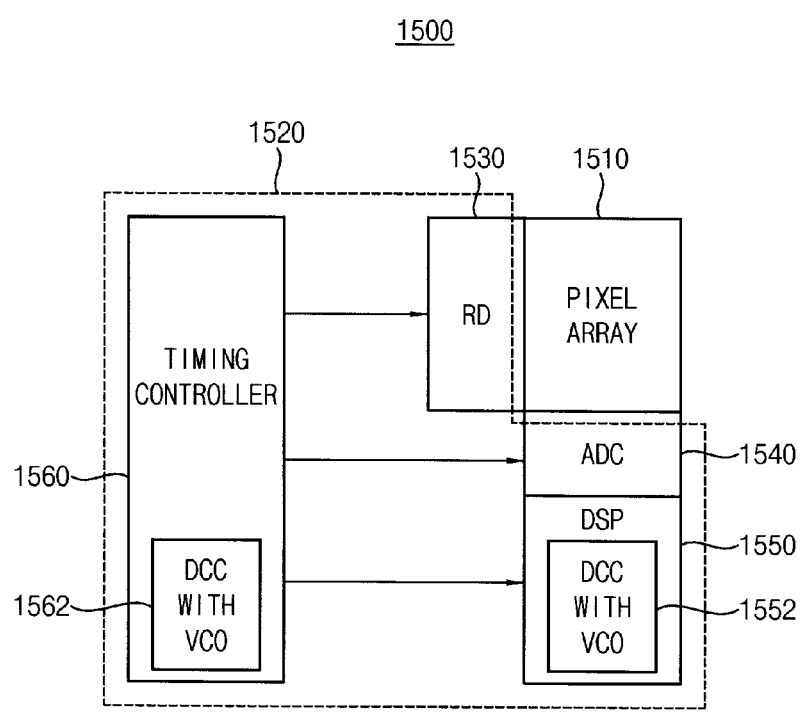
FIG. 15 is a block diagram illustrating an image sensor including a digital duty cycle correction circuit according to exemplary embodiments.

FIG. 15 is a block diagram illustrating an image sensor including the digital duty cycle correction circuit according to an exemplary embodiment.

Referring to FIG. 15, an image sensor 1500 includes a pixel array 1510 and a signal processing unit 1520.

The pixel array 1510 generates electric signals based on incident lights. The pixel array 1510 may include a plurality of unit pixels that are arranged in a matrix form. The plurality of unit pixels may include color pixels for providing color image information and/or depth pixels for providing information (e.g. depth information) about a distance (or a depth) from an object (not illustrated). When the pixel array 1510 includes the depth pixels, the image sensor 1500 may further include a light source module (not illustrated) emitting a transmission light to the object.

The signal processing unit 1520 generates image data based on the electric signals. The signal processing unit 1520 may include a row driver 1530, an analog-to-digital converting (ADC) unit 1540, a digital signal processing (DSP) unit 1550 and a timing controller 1560.

The row driver 1530 may be connected with each row of the pixel array 1510 and may generate driving signals to drive each row. The ADC unit 1540 may be connected with each column of the pixel array 1510 and may convert analog signals from the pixel array 1510 into digital signals. According to an exemplary embodiment, the ADC unit 1540 may include a correlated double sampling (CDS) unit for extracting an effective signal component. The CDS unit may perform an analog double sampling, a digital double sampling or a dual correlated double sampling that performs both the analog double sampling and the digital double sampling. The DSP unit 1550 receives the digital signals output from the ADC unit 130, and performs image data processing on the digital signals. The timing controller 1560 may control the row driving unit 1530, the ADC unit 1540 and the DSP unit 1550 by providing control signals, such as a clock signal, a timing control signal, or the like.

The DSP unit 1550 and the timing controller 1560 may include a digital duty cycle correction circuit 1552 and a digital duty cycle correction circuit 1562, respectively. Each of the digital duty cycle correction circuits 1552 and 1562 may include a voltage controlled oscillator. In each of the digital duty cycle correction circuits 1552 and 1562, duty cycle information of a clock signal may be converted into a frequency value, and a duty cycle of the clock signal may be compensated based on a digital code corresponding to the frequency value. Thus, the digital duty cycle correction circuits 1552 and 1562 may perform the duty cycle correction operation more stably and effectively, and the digital duty cycle correction circuits 1552 and 1562 and the image sensor 1500 may have relatively low power consumption.

Figure 16:
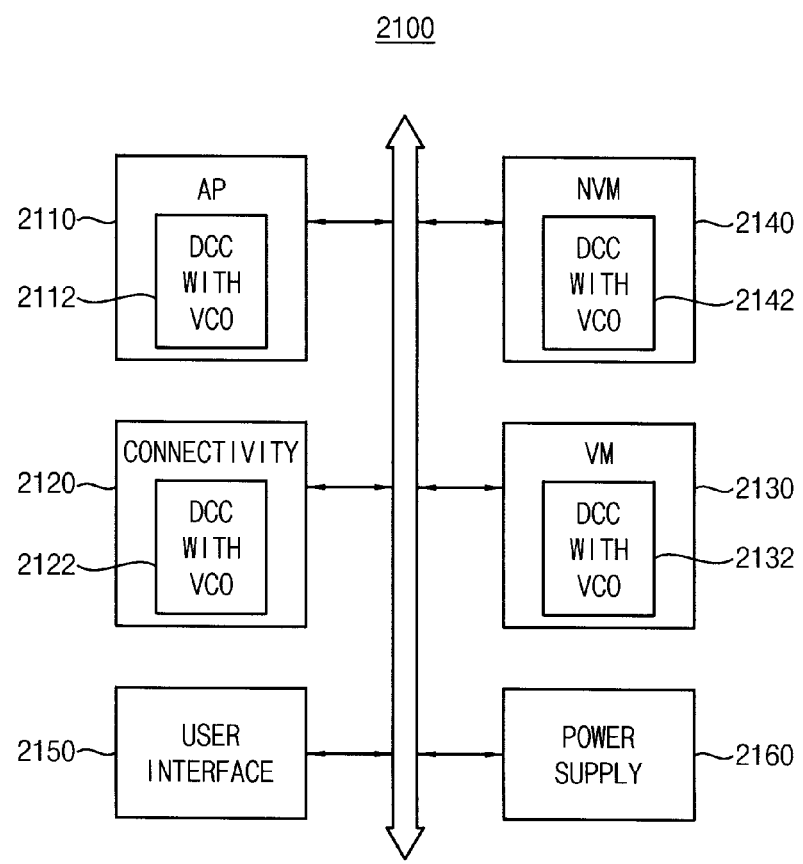
FIG. 16 is a diagram illustrating a mobile system including a digital duty cycle correction circuit according to exemplary embodiments.

FIG. 16 is a diagram illustrating a mobile system including the digital duty cycle correction circuit according to an exemplary embodiment.

Referring to FIG. 16, a mobile system 2100 includes an application processor 2110, a connectivity unit 2120, a volatile memory device 2130, a nonvolatile memory device 2140, a user interface 2150 and a power supply 2160. According to an exemplary embodiment, the mobile system 2100 may be any mobile system, such as a mobile phone, a smart phone, a tablet computer, a laptop computer, a personal digital assistant (PDA), a portable multimedia player (PMP), a digital camera, a portable game console, a music player, a camcorder, a video player, a navigation system, etc.

The application processor 2110 may execute applications, such as an internet browser, a game application, a video player application, etc. According to an exemplary embodiment, the application processor 2110 may include a single processor core or a plurality of processor cores. For example, the application processor 2110 may be a multi-core processor, such as a dual-core processor, a quad-core processor, a hexa-core processor, etc. In an exemplary embodiment, the application processor 2110 may further include a cache memory located inside or outside the application processor 2110.

The connectivity unit 2120 may perform wired or wireless communication with an external device. For example, the connectivity unit 2120 may perform a universal serial bus (USB) communication, an Ethernet communication, a near field communication (NFC), a radio frequency identification (RFID) communication, a mobile telecommunication, a memory card communication, wireless internet, wireless fidelity (Wi-Fi), global positioning system (GPS), Bluetooth (BT), global system for mobile communication (GSM), general packet radio system (GPRS), wideband code division multiple access (WCDMA), high speed uplink/downlink packet access (HSxPA), etc. The connectivity unit 2120 may include a baseband chipset.

The volatile memory device 2130 may store an instruction and/or data processed by the application processor 2110, or may serve as a working memory. For example, the volatile memory device 2130 may be implemented by a DRAM, an SRAM, a mobile DRAM, a dual data rate (DDR) synchronous DRAM (SDRAM), a low power DDR (LPDDR) SDRAM, a graphic DDR (GDDR) SDRAM, a rambus DRAM (RDRAM), or the like.

The nonvolatile memory device 2140 may store a boot image for booting the mobile system 2100. For example, the nonvolatile memory device 2140 may be implemented by an EEPROM, a flash memory, a PRAM, an RRAM, an MRAM, an FRAM, an NFGM, a PoRAM, or the like.

The application processor 2110, the connectivity unit 2120, the volatile memory device 2130 and the nonvolatile memory device 2140 may include a digital duty cycle correction circuit 2112, a digital duty cycle correction circuit 2122, a digital duty cycle correction circuit 2132 and a digital duty cycle correction circuit 2142, respectively. Each of the digital duty cycle correction circuits 2112, 2122, 2132 and 2142 may include a voltage controlled oscillator. In each of the digital duty cycle correction circuits 2112, 2122, 2132 and 2142, duty cycle information of a clock signal may be converted into a frequency value, and a duty cycle of the clock signal may be compensated based on a digital code corresponding to the frequency value. Thus, the digital duty cycle correction circuits 2112, 2122, 2132 and 2142 may perform the duty cycle correction operation more stably and effectively, and the digital duty cycle correction circuits 2112, 2122, 2132 and 2142 and the mobile system 2100 may have relatively low power consumption.

The user interface 2150 may include at least one input device, such as a keypad, a touch screen, etc., and at least one output device, such as a display device, a speaker, etc. The power supply 2160 may supply the mobile system 2100 with power. In an exemplary embodiment, the mobile system 2100 may further include a camera image processor (CIS), a storage device, such as a memory card, a solid state drive SSD, a compact disc read-only memory (CD-ROM), etc.

According to an exemplary embodiment, the mobile system 2100 and/or components of the mobile system 2100 may be packaged in various forms, such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline IC (SOIC), shrink small outline package (SSOP), thin small outline package (TSOP), system in package (SIP), multi-chip package (MCP), wafer-level fabricated package (WFP), or wafer-level processed stack package (WSP).

Figure 17:
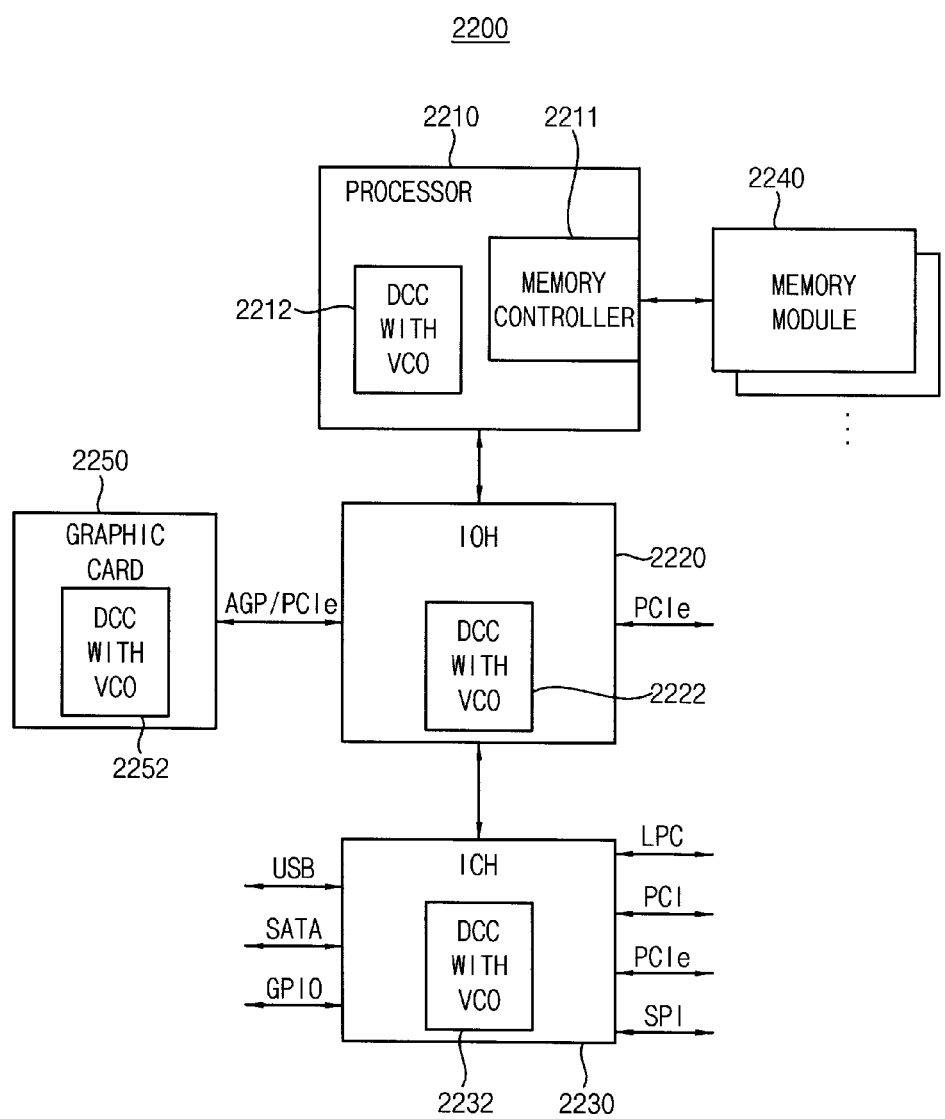
FIG. 17 is a diagram illustrating a computing system including a digital duty cycle correction circuit according to exemplary embodiments.

FIG. 17 is a diagram illustrating a computing system including the digital duty cycle correction circuit according to an exemplary embodiment.

Referring to FIG. 17, a computing system 2200 includes a processor 2210, an I/O hub (IOH) 2220, an I/O controller hub (ICH) 2230, at least one memory module 2240 and a graphic card 2250. According to an exemplary embodiment, the computing system 2200 may be any computing system, such as a personal computer (PC), a server computer, a workstation, a tablet computer, a laptop computer, a mobile phone, a smart phone, a PDA, a PMP, a digital camera, a digital television, a set-top box, a music player, a portable game console, a navigation device, etc.

The processor 2210 may perform specific calculations or tasks. For example, the processor 2210 may be a microprocessor, a central process unit (CPU), a digital signal processor, or the like. According to an exemplary embodiment, the processor 2210 may include a single processor core or a plurality of processor cores. For example, the processor 2210 may be a multi-core processor, such as a dual-core processor, a quad-core processor, a hexa-core processor, etc. Although FIG. 17 illustrates an example of the computing system 2200 including one processor 2210, according to an exemplary embodiment, the computing system 2200 may include a plurality of processors. In an exemplary embodiment, the processor 2210 may further include a cache memory located inside or outside the processor 2210.

The processor 2210 may include a memory controller 2211 that controls an operation of the memory module 2240. The memory controller 2211 included in the processor 2210 may be referred to as an integrated memory controller (IMC). A memory interface between the memory controller 2211 and the memory module 2240 may be implemented by one channel including a plurality of signal lines, or by a plurality of channels. Each channel may be coupled to at least one memory module 2240. In an exemplary embodiment, the memory controller 2211 may be included in the I/O hub 2220. The I/O hub 2220 including the memory controller 2211 may be referred to as a memory controller hub (MCH). The memory module 2240 may include a plurality of volatile or nonvolatile memory devices that store data provided from the memory controller 2211.

The I/O hub 2220 may manage data transfer between the processor 2210 and devices, such as the graphic card 2250. The I/O hub 2220 may be coupled to the processor 2210 via at least one of various interfaces, such as a front side bus (FSB), a system bus, a HyperTransport, a lightning data transport (LDT), a QuickPath interconnect (QPI), a common system interface (CSI), etc. Although FIG. 17 illustrates an example of the computing system 2200 including one I/O hub 2220, according to an exemplary embodiment, the computing system 2200 may include a plurality of I/O hubs.

The I/O hub 2220 may provide various interfaces with the devices. For example, the I/O hub 2220 may provide an accelerated graphics port (AGP) interface, a peripheral component interface-express (PCIe), a communications streaming architecture (CSA) interface, etc.

The graphic card 2250 may be coupled to the I/O hub 2220 via the AGP or the PCIe. The graphic card 2250 may control a display device (not illustrated) for displaying an image. The graphic card 2250 may include an internal processor and an internal memory to process the image. In an exemplary embodiment, the input/output hub 2220 may include an internal graphic device along with or instead of the graphic card 2250. The internal graphic device may be referred to as an integrated graphics, and an I/O hub including the memory controller and the internal graphic device may be referred to as a graphics and memory controller hub (GMCH).

The I/O controller hub 2230 may perform data buffering and interface arbitration to efficiently operate various system interfaces. The I/O controller hub 2230 may be coupled to the I/O hub 2220 via an internal bus. For example, the I/O controller hub 2230 may be coupled to the I/O hub 2220 via at least one of various interfaces, such as a direct media interface (DMI), a hub interface, an enterprise Southbridge interface (ESI), PCIe, etc.

The I/O controller hub 2230 may provide various interfaces with peripheral devices. For example, the I/O controller hub 2230 may provide a universal serial bus (USB) port, a serial advanced technology attachment (SATA) port, a general purpose input/output (GPIO), a low pin count (LPC) bus, a serial peripheral interface (SPI), a PCI, a PCIe, etc.

The processor 2210, the I/O hub 2220, the I/O controller hub 2230 and the graphic card 2250 may include a digital duty cycle correction circuit 2212, a digital duty cycle correction circuit 2222, a digital duty cycle correction circuit 2232 and a digital duty cycle correction circuit 2252, respectively. Each of the digital duty cycle correction circuits 2212, 2222, 2232 and 2252 may include a voltage controlled oscillator. In each of the digital duty cycle correction circuits 2212, 2222, 2232 and 2252, duty cycle information of a clock signal may be converted into a frequency value, and a duty cycle of the clock signal may be compensated based on a digital code corresponding to the frequency value. Thus, the digital duty cycle correction circuits 2212, 2222, 2232 and 2252 may perform the duty cycle correction operation more stably and effectively, and the digital duty cycle correction circuits 2212, 2222, 2232 and 2252 and the computing system 2200 may have relatively low power consumption.

In an exemplary embodiment, the processor 2210, the I/O hub 2220 and the I/O controller hub 2230 may be implemented as separate chipsets or separate integrated circuits. In an alternative embodiment, at least two among the processor 2210, the I/O hub 2220 and the I/O controller hub 2230 may be implemented as one chipset.

The above described exemplary embodiments may be used in any device or system including a digital duty cycle correction circuit, such as a mobile phone, a smart phone, a PDA, a PMP, a digital camera, a digital television, a set-top box, a music player, a portable game console, a navigation device, a PC, a server computer, a workstation, a tablet computer, a laptop computer, a smart card, a printer, etc.

As described above, a digital duty cycle correction circuit according to exemplary embodiments may include a voltage controlled oscillator. In the digital duty cycle correction circuit, duty cycle information of a clock signal may be converted into a frequency value, a duty cycle of the clock signal may be compensated based on a digital code corresponding to the frequency value, and thus the digital duty cycle correction circuit may perform a duty cycle correction operation more stably and effectively. In addition, a digital duty control code generator of the digital duty cycle correction circuit except a storage thereof may be disabled after the digital duty control code is determined, and thus the digital duty cycle correction circuit may have relatively low power consumption.

The foregoing exemplary embodiments and advantages are merely exemplary and are not to be construed as limiting. The present teaching can be readily applied to other types of apparatuses. Also, the description of the exemplary embodiments is intended to be illustrative, and not to limit the scope of the claims, and many alternatives, modifications, and variations will be apparent to those skilled in the art.

What is claimed is:

1. A digital duty cycle correction circuit comprising:
   a duty cycle controller configured to generate a first output clock signal and a second output clock signal by compensating a duty cycle of a first input clock signal and a duty cycle of a second input clock signal based on a digital duty control code, the first and second input clock signals being a pair of differential signals, the first and second output clock signals being a pair of differential signals; and
   a digital duty control code generator configured to generate the digital duty control code based on a frequency value obtained by converting duty cycle information of the first output clock signal and the second output clock signal,
   wherein the digital duty control code generator comprises:
   a monitor configured to generate a first direct current (DC) voltage and a second DC voltage by monitoring the first output clock signal and the second output clock signal;
   a voltage-frequency converter configured to generate a reference frequency signal, a first frequency signal and a second frequency signal by performing a voltage-frequency conversion on a reference voltage, the first DC voltage and the second DC voltage;
   a frequency counter configured to generate a reference count value, a first count value and a second count value by counting pulses of the reference frequency signal, pulses of the first frequency signal and pulses of the second frequency signal; and
   a digital state machine configured to generate the digital duty control code based on the reference count value, the first count value and the second count value.

2. The digital duty cycle correction circuit of claim 1, wherein the digital duty control code includes an up code and a down code, and wherein the duty cycle controller includes:
   an amplifier configured to amplify the first input clock signal and the second input clock signal;
   a first duty cycle correction buffer configured to generate the first output clock signal by compensating a duty cycle of the amplified first input clock signal based on the up code and the down code; and
   a second duty cycle correction buffer configured to generate the second output clock signal by compensating a duty cycle of the amplified second input clock signal based on the up code and the down code.

3. The digital duty cycle correction circuit of claim 2, wherein the first duty cycle correction buffer includes:
   a plurality of correction buffers, each of the plurality of correction buffers being connected to a first node and a second node, the first node configured to receive the amplified first input clock signal; and
   an inverter configured to generate the first output clock signal by inverting a voltage at the second node.

4. The digital duty cycle correction circuit of claim 3, wherein each of the plurality of correction buffers includes:
   a first p-type metal oxide semiconductor (PMOS) transistor having a first terminal configured to receive a power supply voltage, a gate terminal and a second terminal;
   a second PMOS transistor having a first terminal connected to the second terminal of the first PMOS transistor, a gate terminal connected to the first node and a second terminal connected to the second node;
   a first n-type metal oxide semiconductor (NMOS) transistor having a first terminal connected to the second node, a gate terminal connected to the first node and a second terminal; and
   a second NMOS transistor having a first terminal connected to the second terminal of the first NMOS transistor, a gate terminal and a second terminal configured to receive a ground voltage.

5. The digital duty cycle correction circuit of claim 4, wherein, in a first correction buffer of the plurality of correction buffers, the gate terminal of the first PMOS transistor receives the ground voltage and the gate terminal of the second NMOS transistor receives the power supply voltage.

6. The digital duty cycle correction circuit of claim 5, wherein, in each of the plurality of correction buffers except the first correction buffer, the gate terminal of the first PMOS transistor receives one bit of the down code and the gate terminal of the second NMOS transistor receives one bit of the up code.

7. The digital duty cycle correction circuit of claim 1, wherein the monitor includes:
   a first low pass filter configured to generate the first DC voltage by low pass filtering the first output clock signal; and
   a second low pass filter configured to generate the second DC voltage by low pass filtering the second output clock signal.

8. The digital duty cycle correction circuit of claim 1, wherein the voltage-frequency converter includes:
   an analog multiplexer configured to output one of the reference voltage, the first DC voltage and the second DC voltage based on a selection signal; and
   a voltage controlled oscillator configured to generate the reference frequency signal, the first frequency signal and the second frequency signal based on an output of the analog multiplexer.

9. The digital duty cycle correction circuit of claim 1, wherein the digital state machine determines a first correction code by comparing the reference count value with the first count value, determines a second correction code by comparing the reference count value with the second count value, and determines the digital duty control code based on the first correction code and the second correction code.

10. The digital duty cycle correction circuit of claim 9, wherein the digital state machine updates the first correction code when a first difference between the reference count value and the first count value is greater than a predetermined tolerance, maintains the first correction code when the first difference is equal to or less than the predetermined tolerance, updates the second correction code when a second difference between the reference count value and the second count value is greater than the predetermined tolerance, maintains the second correction code when the second difference is equal to or less than the predetermined tolerance, and determines the digital duty control code by averaging the first correction code and the second correction code.

11. The digital duty cycle correction circuit of claim 1, further comprising:
   a buffer disposed at a next-stage of the duty cycle controller, the buffer configured to generate a third output clock signal and a fourth output clock signal by buffering the first output clock signal and the second output clock signal, the third and fourth output clock signals being a pair of differential signals.

12. The digital duty cycle correction circuit of claim 11, wherein the monitor further generates a third DC voltage and a fourth DC voltage by monitoring the third output clock signal and the fourth output clock signal, wherein the voltage-frequency converter further generates a third frequency signal and a fourth frequency signal by performing the voltage-frequency conversion on the third DC voltage and the fourth DC voltage, wherein the frequency counter further generates a third count value and a fourth count value by counting pulses of the third frequency signal and pulses of the fourth frequency signal, and
   wherein the digital state machine generates the digital duty control code based on the reference count value, the first count value and the second count value, or based on the reference count value, third count value and the fourth count value.

13. The digital duty cycle correction circuit of claim 1, wherein the digital state machine includes a storage configured to store the digital duty control code,
   wherein the monitor, the voltage-frequency converter, the frequency counter and the digital state machine except the storage are disabled after the digital duty control code is determined.

14. The digital duty cycle correction circuit of claim 1, wherein the digital duty control code is periodically updated after the digital duty control code is determined.

15. A digital duty cycle correction circuit comprising:
   a duty cycle controller configured to generate a first output clock signal by compensating a duty cycle of a first input clock signal based on a digital duty control code;
   a monitor configured to generate a first direct current (DC) voltage by monitoring the first output clock signal;
   a voltage-frequency converter configured to generate a reference frequency signal and a first frequency signal by performing a voltage-frequency conversion on a reference voltage and the first DC voltage;
   a frequency counter configured to generate a reference count value and a first count value by counting pulses of the reference frequency signal and pulses of the first frequency signal; and
   a digital state machine configured to generate the digital duty control code based on the reference count value and the first count value.

16. An integrated circuit device, comprising:
   a digital duty cycle correction circuit configured to generate an output clock signal by adjusting a duty cycle of the input clock signal based on a digital duty control code corresponding to duty cycle information of the output clock signal; and
   an integrated circuit configured to operate based on the output clock signal,
   wherein the digital duty cycle correction circuit comprises:
      a duty cycle controller configured to generate the output clock signal by compensating a duty cycle of the input clock signal based on the digital duty control code;
      a monitor configured to generate a direct current (DC) voltage by monitoring the output clock signal;
      a voltage-frequency converter configured to generate a reference frequency signal and a frequency signal by performing a voltage-frequency conversion on a reference voltage and the DC voltage;
      a frequency counter configured to generate a reference count value and a count value by counting pulses of the reference frequency signal and pulses of the frequency signal; and
      a digital state machine configured to generate the digital duty control code based on the reference count value and the count value.

17. The integrated circuit device of claim 16, wherein the digital duty cycle correction circuit generates the digital duty control code based on a frequency value obtained by converting the duty cycle information of the output clock signal.

18. The integrated circuit device of claim 17, wherein the digital duty cycle correction circuit further comprises a voltage controlled oscillator to convert the duty cycle information of the output clock signal into the frequency value.

* * * * *